(12) United States Patent
Lee et al.

(10) Patent No.: US 11,469,268 B2
(45) Date of Patent: Oct. 11, 2022

(54) DAMASCENE-BASED APPROACHES FOR EMBEDDING SPIN HALL MTJ DEVICES INTO A LOGIC PROCESSOR AND THE RESULTING STRUCTURES

(71) Applicant: Intel Corporation, Santa Clara, CA (US)

(72) Inventors: Kevin J. Lee, Beaverton, OR (US); Yih Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 17 days.

(21) Appl. No.: 16/067,803

(22) PCT Filed: Mar. 18, 2016

(86) PCT No.: PCT/US2016/023155
§ 371 (c)(1),
(2) Date: Jul. 2, 2018

(87) PCT Pub. No.: WO2017/160311
PCT Pub. Date: Sep. 21, 2017

(65) Prior Publication Data
US 2019/0013354 A1    Jan. 10, 2019

(51) Int. Cl.
*H01L 27/22* (2006.01)
*G11C 11/16* (2006.01)
(Continued)

(52) U.S. Cl.
CPC .......... *H01L 27/228* (2013.01); *G11C 11/16* (2013.01); *G11C 11/161* (2013.01);
(Continued)

(58) Field of Classification Search
CPC ..... H01L 27/22; H01L 27/222; H01L 27/226; H01L 27/288; H01L 43/04; H01L 43/06;
(Continued)

(56) References Cited

U.S. PATENT DOCUMENTS 6,706,571 B1 * 3/2004 Yu ..................... H01L 29/4908
                                                        257/E29.151
6,784,510 B1 * 8/2004 Grynkewich .......... B82Y 10/00
                                                        257/225
(Continued)

FOREIGN PATENT DOCUMENTS

CN         102376737        3/2012
WO     WO-2014-025838       2/2014
(Continued)

OTHER PUBLICATIONS

International Search Report and Written Opinion for International Patent Application No. PCT/US2016/023155 dated Nov. 25, 2016, 11 pgs.

*Primary Examiner* — Herve-Louis Y Assouman
*Assistant Examiner* — Christopher M Roland
(74) *Attorney, Agent, or Firm* — Schwabe, Williamson & Wyatt, P.C.

(57) ABSTRACT

Damascene-based approaches for embedding spin hall MTJ devices into a logic processor, and the resulting structures, are described. In an example, a logic processor includes a logic region including a metallization layer. The logic processor also includes a memory array including a plurality of two-transistor one magnetic tunnel junction (MTJ) spin hall effect electrode (2T-1MTJ SHE electrode) bit cells. The spin hall effect electrodes of the 2T-1MTJ SHE electrode bit cells are disposed in a lower dielectric layer laterally adjacent to the metallization layer of the logic region. The MTJs of the 2T-1MTJ SHE electrode bit cells are disposed in an upper dielectric layer laterally adjacent to the metallization layer of the logic region.

20 Claims, 18 Drawing Sheets

(51) Int. Cl.

| | |
|---|---|
| *H01L 43/06* | (2006.01) |
| *H01F 41/34* | (2006.01) |
| *H01L 23/528* | (2006.01) |
| *H01L 43/04* | (2006.01) |
| *H01L 43/14* | (2006.01) |
| *H01L 43/12* | (2006.01) |
| *H01F 10/32* | (2006.01) |
| *H01L 21/8234* | (2006.01) |
| *H01L 29/78* | (2006.01) |

(52) U.S. Cl.
CPC ....... *H01F 10/329* (2013.01); *H01F 10/3254* (2013.01); *H01F 41/34* (2013.01); *H01L 21/823431* (2013.01); *H01L 21/823475* (2013.01); *H01L 23/528* (2013.01); *H01L 27/22* (2013.01); *H01L 27/222* (2013.01); *H01L 27/226* (2013.01); *H01L 43/04* (2013.01); *H01L 43/06* (2013.01); *H01L 43/12* (2013.01); *H01L 43/14* (2013.01); *H01L 29/785* (2013.01)

(58) Field of Classification Search
CPC ....... H01L 43/12; H01L 43/14; H01L 27/228; H01L 21/823431; H01L 21/823475; H01L 23/528; H01L 29/785; H01F 41/34; H01F 10/3254; H01F 10/329; G11C 11/16; G11C 11/161
See application file for complete search history.

(56) References Cited

U.S. PATENT DOCUMENTS

| | | | |
|---|---|---|---|
| 8,963,222 B2 | 2/2015 | Guo | |
| 2009/0218600 A1* | 9/2009 | Park | G06F 17/5068 257/202 |
| 2011/0129946 A1* | 6/2011 | Zhong | H01L 27/228 438/3 |
| 2011/0233699 A1* | 9/2011 | Takenaga | G11C 11/1659 257/E29.323 |
| 2011/0241142 A1* | 10/2011 | Matsubara | H01L 43/08 257/422 |
| 2015/0171314 A1* | 6/2015 | Li | G11C 11/161 257/421 |
| 2016/0268336 A1* | 9/2016 | Shum | H01L 43/12 |
| 2017/0092693 A1* | 3/2017 | Tan | H01L 27/228 |

FOREIGN PATENT DOCUMENTS

| | | |
|---|---|---|
| WO | WO-2014-142922 | 9/2014 |
| WO | WO-2016-011435 | 1/2016 |

\* cited by examiner

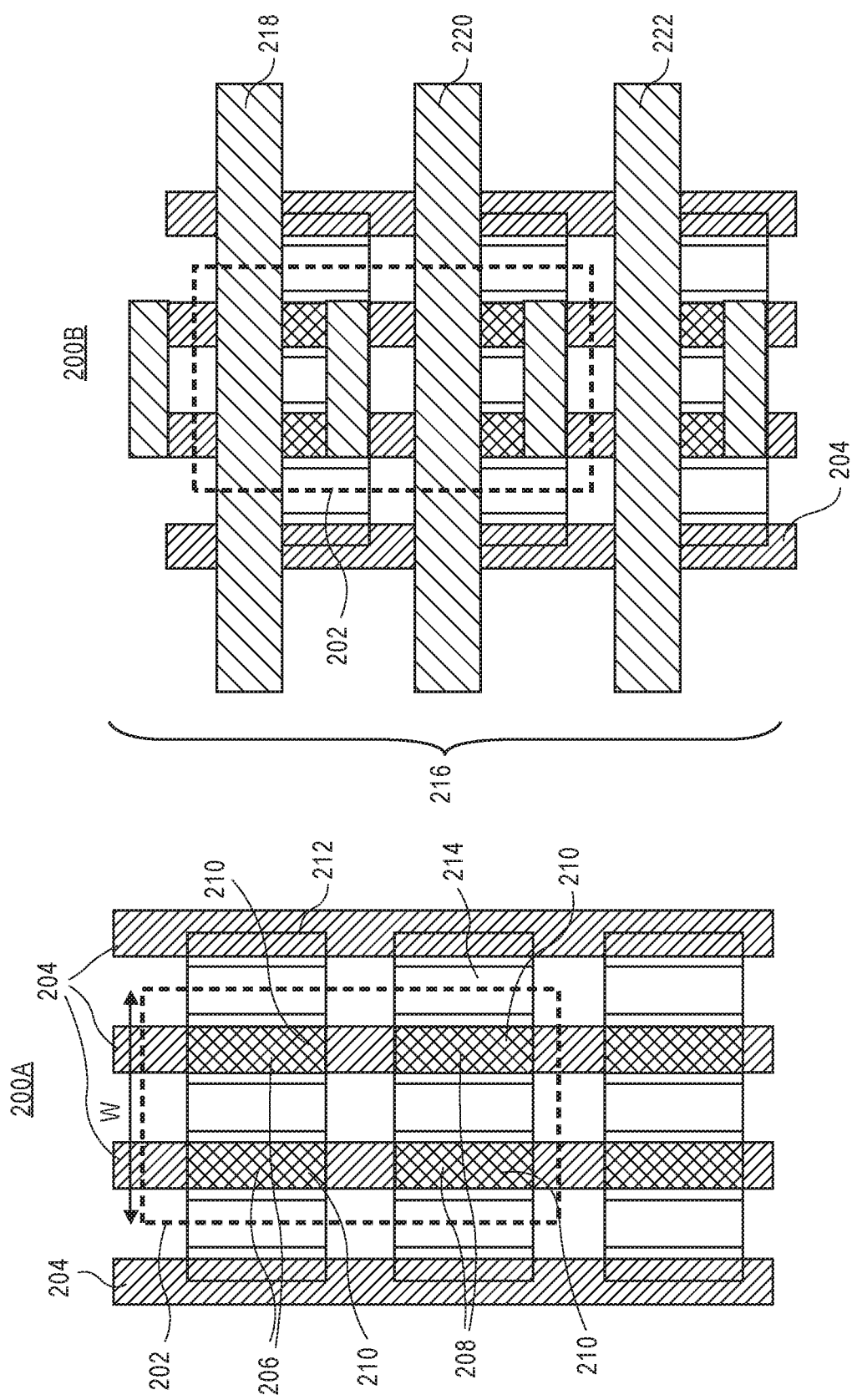

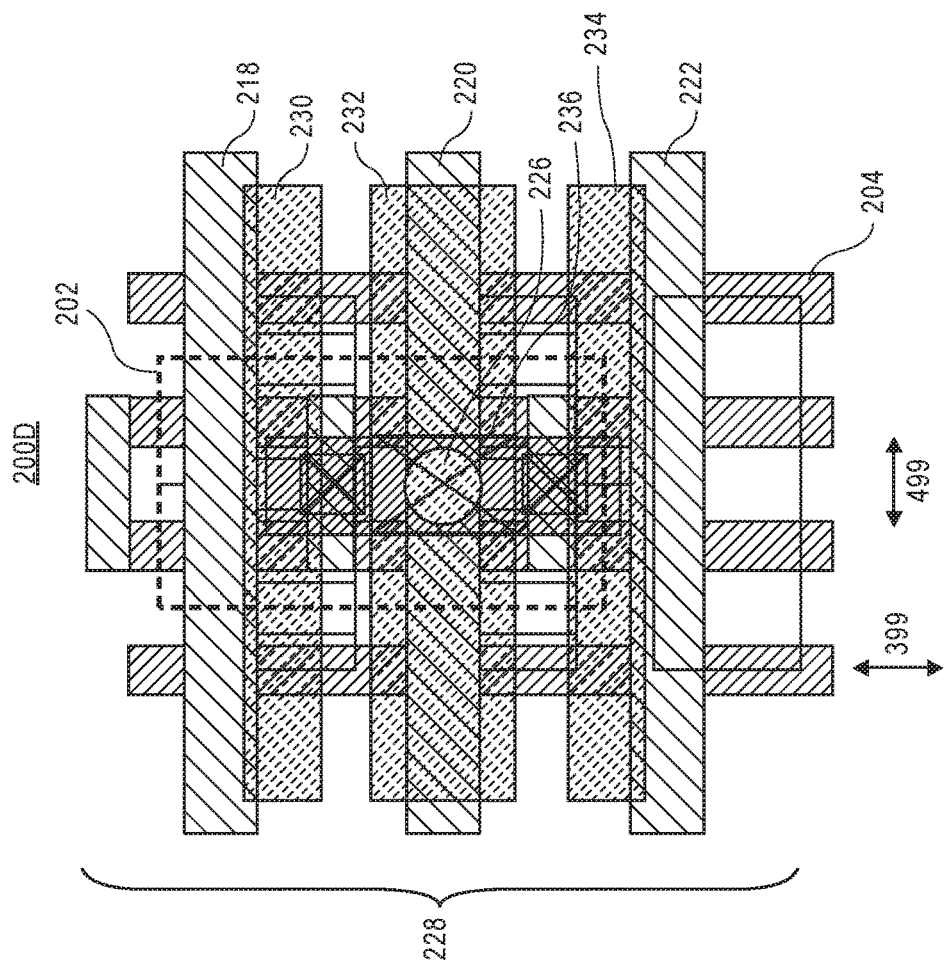
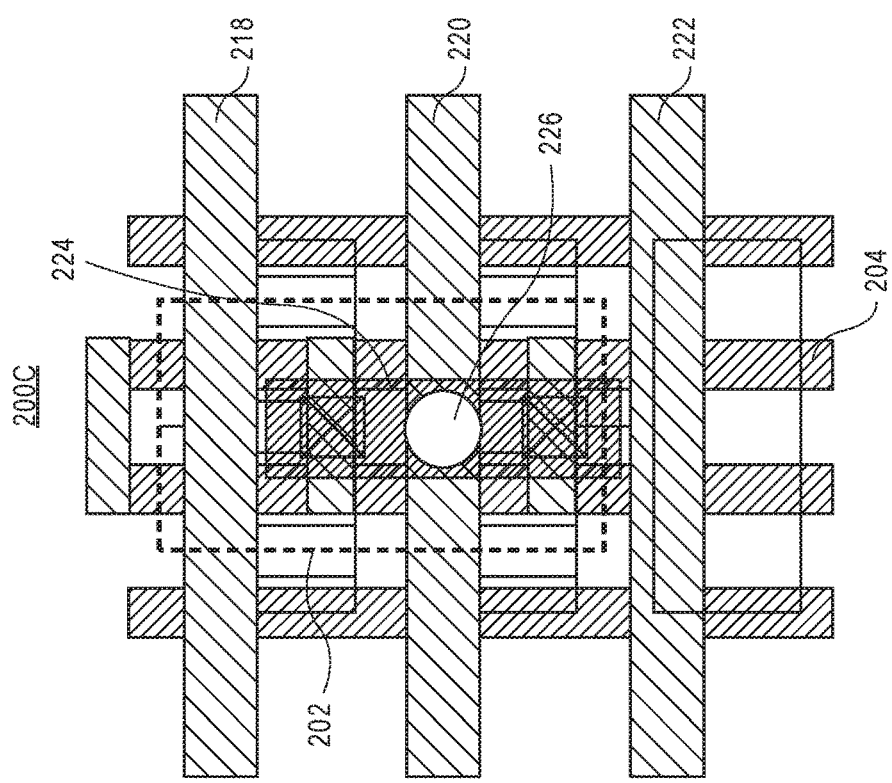
FIG. 2D
FIG. 2C

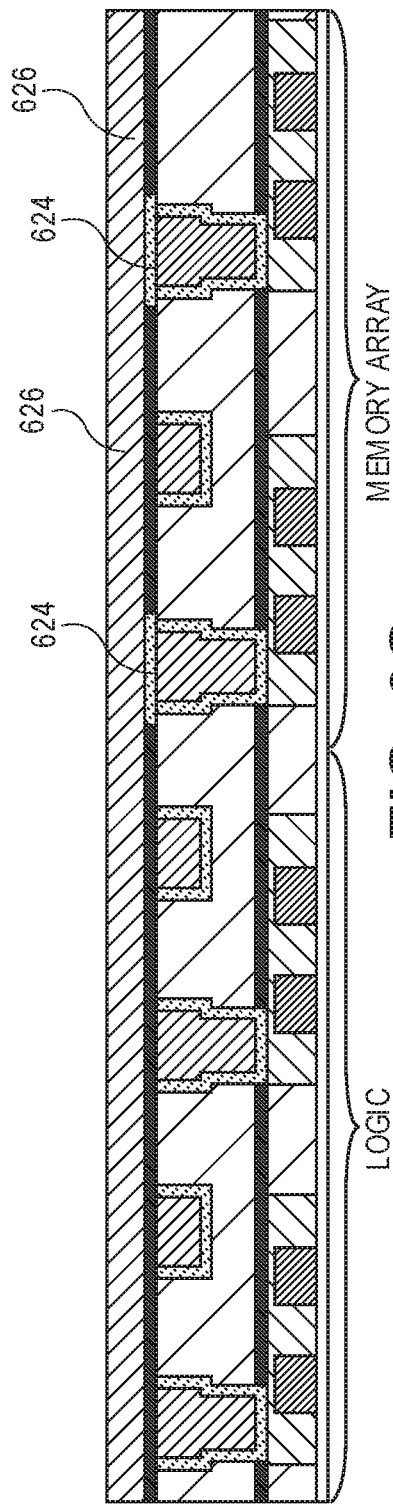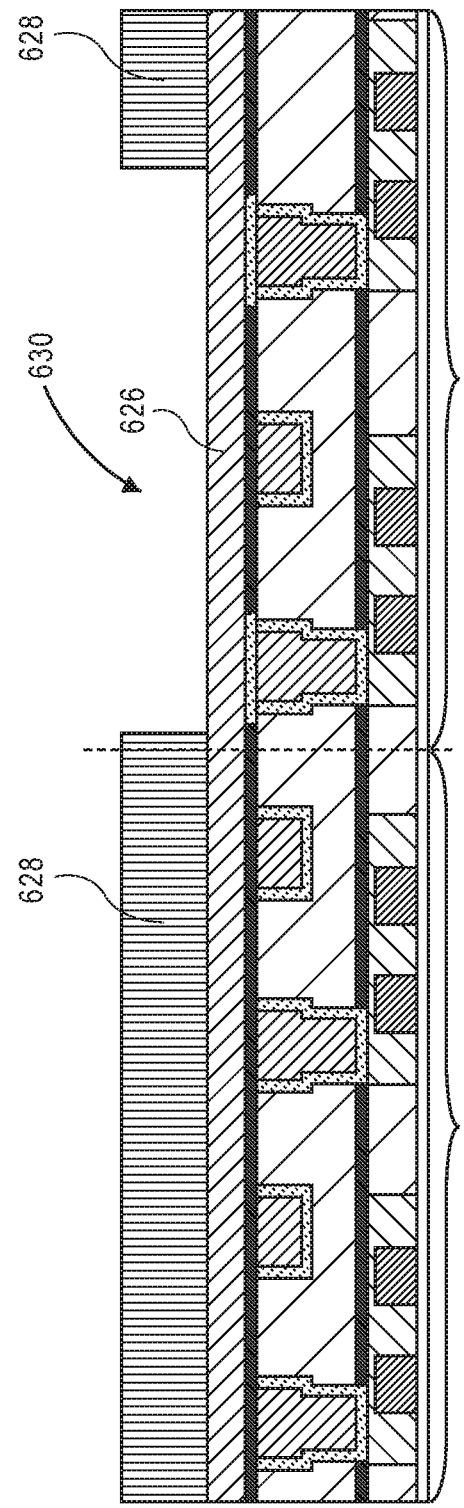

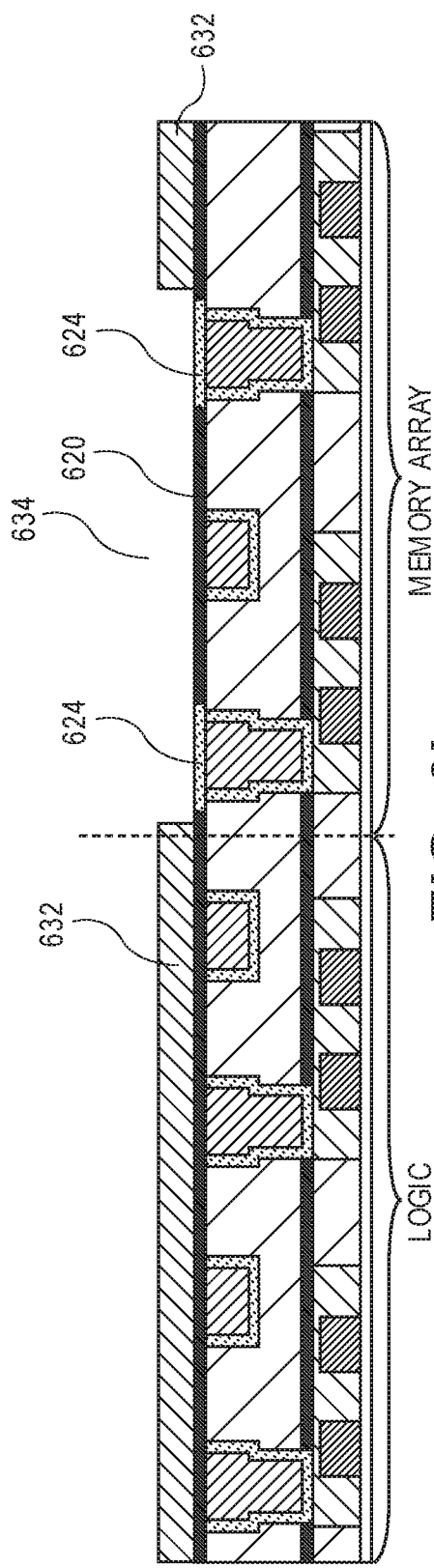
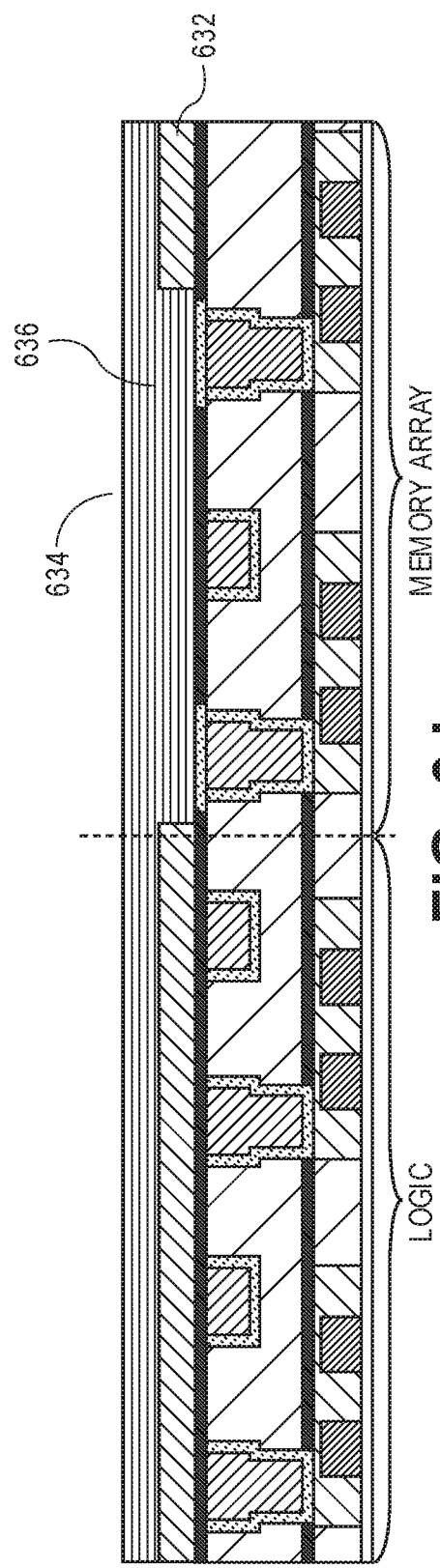

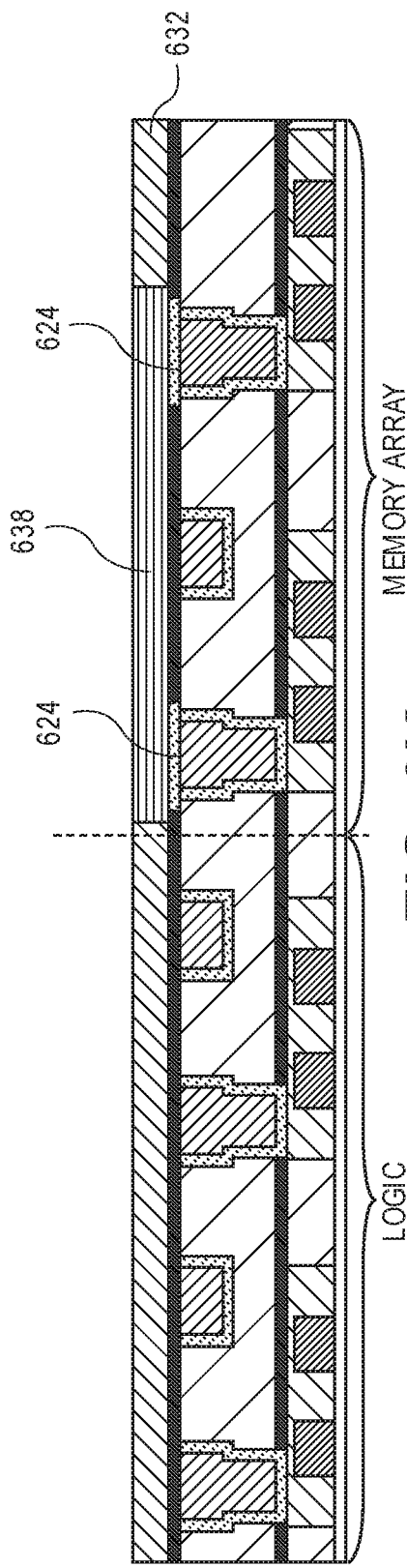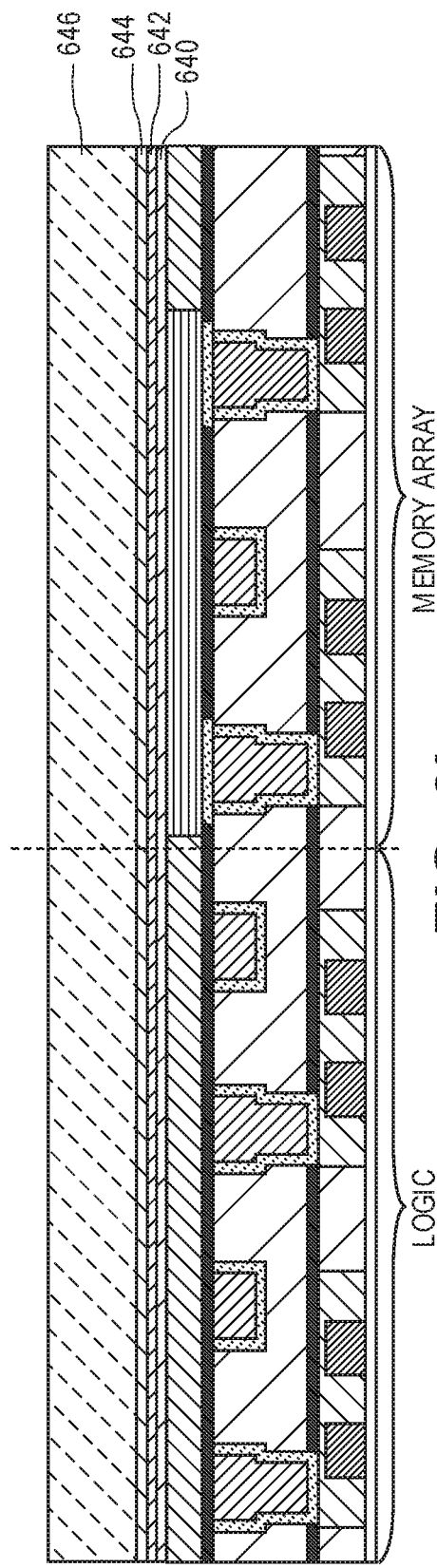

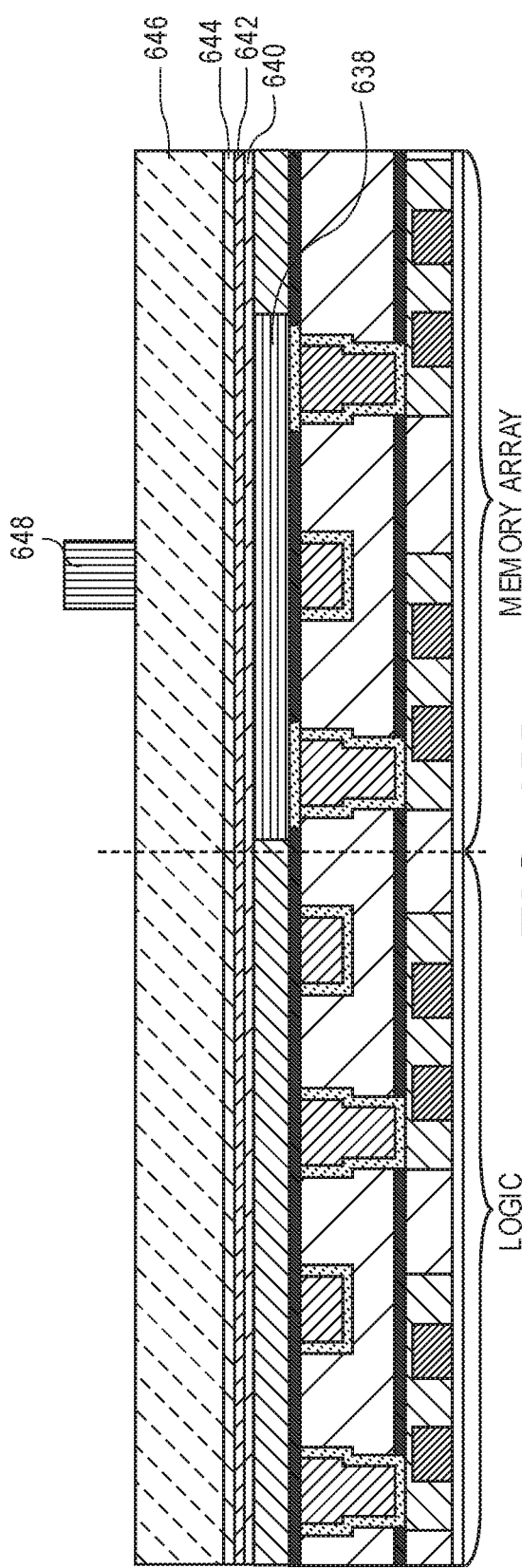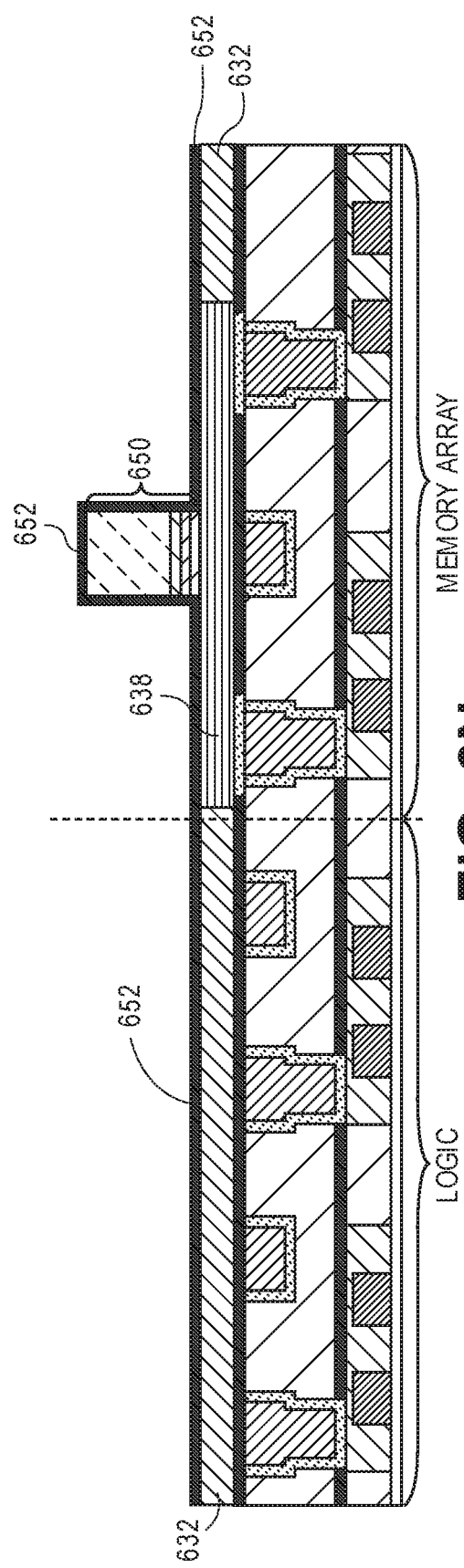

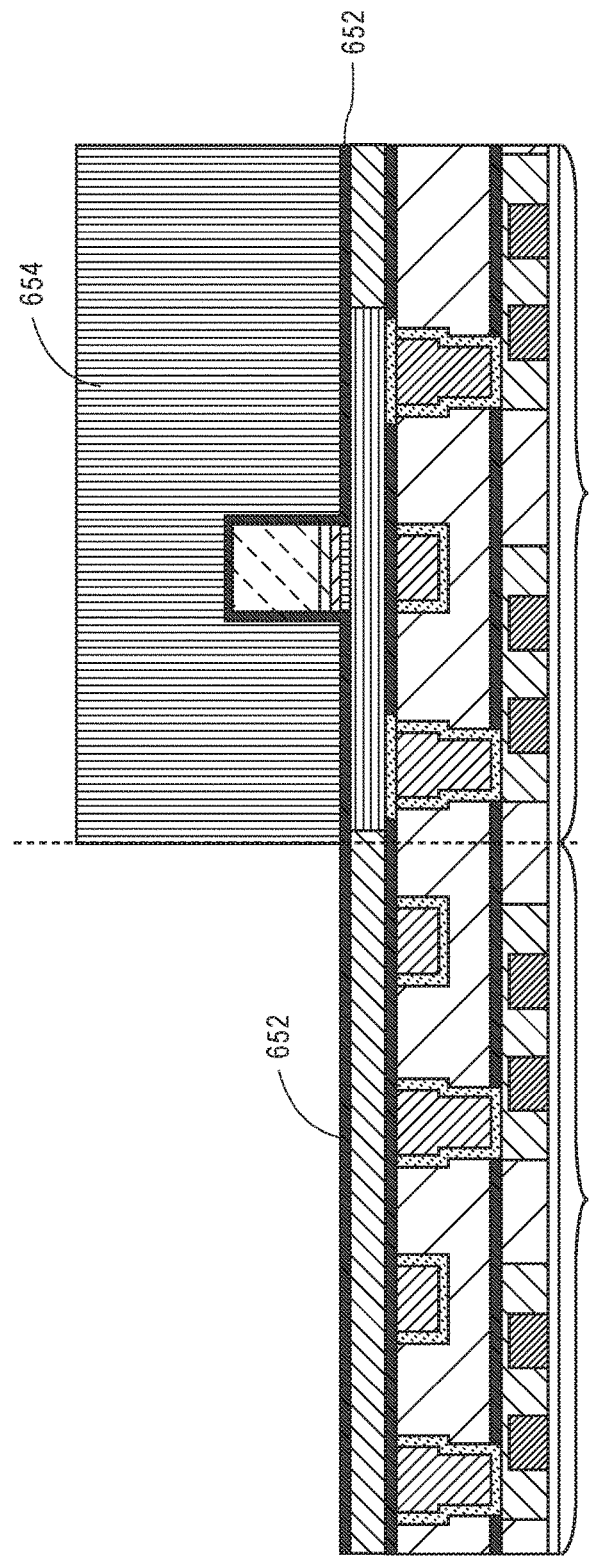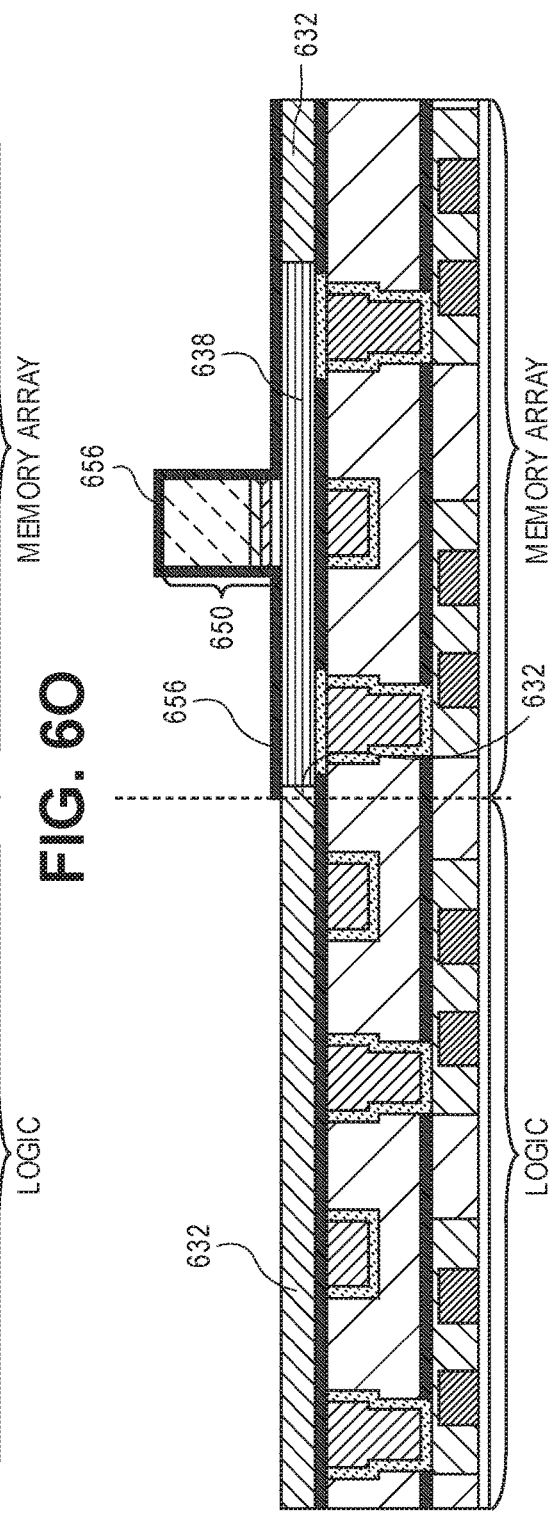
FIG. 6O
FIG. 6P

DAMASCENE-BASED APPROACHES FOR EMBEDDING SPIN HALL MTJ DEVICES INTO A LOGIC PROCESSOR AND THE RESULTING STRUCTURES

CROSS-REFERENCE TO RELATED APPLICATION

This patent application is a U.S. National Phase Application under 35 U.S.C. § 371 of International Application No. PCT/US2016/023155, filed Mar. 18, 2016, entitled "DAMASCENE-BASED APPROACHES FOR EMBEDDING SPIN HALL MTJ DEVICES INTO A LOGIC PROCESSOR AND THE RESULTING STRUCTURES," which designates the United States of America, the entire disclosure of which is hereby incorporated by reference in its entirety and for all purposes.

TECHNICAL FIELD

Embodiments of the invention are in the field of memory devices and, in particular, damascene-based approaches for embedding spin hall MTJ devices into a logic processor, and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Non-volatile embedded memory, e.g., on-chip embedded memory with non-volatility, can enable energy and computational efficiency. However, leading embedded memory options such as spin torque transfer magnetoresistive random access memory (STT-MRAM) can suffer from high voltage and high current density problems during the programming (writing) of the cell. Furthermore, there may be density limitations of STT-MRAM due to large write switching current and select transistor requirements. Specifically, traditional STT-MRAM has a cell size limitation due to the drive transistor requirement to provide sufficient spin current. Furthermore, such memory is associated with large write current (>100 µA) and voltage (>0.7 V) requirements of conventional magnetic tunnel junction (MTJ) based devices.

As such, significant improvements are still needed in the area of non-volatile memory arrays based on MTJs.

BRIEF DESCRIPTION OF THE DRAWINGS

FIG. 2A illustrates a top-down schematic view of a 2T-1MTJ SHE STT-MRAM bit cell highlighting transistor and diffusion contact features, in accordance with an embodiment of the present invention.

FIG. 2B illustrates a top-down schematic view of a 2T-1MTJ SHE STT-MRAM bit cell highlighting transistor, diffusion contact, and metal 1 features, in accordance with an embodiment of the present invention.

FIG. 2C illustrates a top-down schematic view of a 2T-1MTJ SHE STT-MRAM bit cell highlighting transistor, diffusion contact, metal 1, MTJ and spin-hall metal features, in accordance with an embodiment of the present invention.

FIG. 2D illustrates a top-down schematic view of a 2T-1MTJ SHE STT-MRAM bit cell highlighting metal 3 and via 2 features, in accordance with an embodiment of the present invention.

FIGS. 6A-6S illustrate cross-sectional views representing various processing operations in a method of fabricating logic regions together with 2T-1MTJ SHE STT-MRAM bit cell arrays on a common substrate, in accordance with an embodiment of the present invention, wherein:

FIG. 6A illustrates a starting structure in the method of fabricating logic regions together with 2T-1MTJ SHE STT-MRAM bit cell arrays on a common substrate;

FIG. 6G illustrates the structure of FIG. 6F following formation of a lower interlayer dielectric layer;

FIG. 6H illustrates the structure of FIG. 6G following formation and patterning of a photoresist layer;

FIG. 6I illustrates the structure of FIG. 6H following an anisotropic dry etch process used to transfer the resist pattern into the lower ILD layer;

FIG. 6J illustrates the structure of FIG. 6I following formation of a spin hall effect metal layer;

FIG. 6K illustrates the structure of FIG. 6J following planarization to remove overburden of the spin hall effect metal layer;

FIG. 6L illustrates the structure of FIG. 6F following formation of MTJ free layer film(s), tunnel barrier material, MTJ fixed layer film(s), and MTJ hard mask metallization films;

FIG. 6M illustrates the structure of FIG. 6L following formation and patterning of a photoresist layer;

FIG. 6N illustrates the structure of FIG. 6M following patterning to form an MTJ stack;

FIG. 6O illustrates the structure of FIG. 6N following formation and patterning of a photoresist layer;

FIG. 6P illustrates the structure of FIG. 6O following patterning to form a patterned polish-stop material layer;

FIG. 6S illustrates the structure of FIG. 6R following fabrication of M2/V1 copper interconnect structures in the logic areas of the structure.

DESCRIPTION OF THE EMBODIMENTS

Damascene-based approaches for embedding spin hall MTJ devices into a logic processor, and the resulting structures, are described. In the following description, numerous specific details are set forth, such as specific magnetic tunnel junction (MTJ) layer regimes, in order to provide a thorough understanding of embodiments of the present invention. It will be apparent to one skilled in the art that embodiments of the present invention may be practiced without these specific details. In other instances, well-known features, such as operations associated with embedded memory, are not described in detail in order to not unnecessarily obscure embodiments of the present invention. Furthermore, it is to be understood that the various embodiments shown in the Figures are illustrative representations and are not necessarily drawn to scale.

One or embodiments of the present invention is directed to fabrication approaches for embedding two-transistor one-MTJ (2T-1MTJ) spin hall effect (SHE) spin torque transfer magnetoresistive random access memory (STT-MRAM) bit cell arrays into a logic processor. In one embodiment, an approach involves using a device-first process flow and damascene-patterned SHE metal lines.

More specifically, a fabrication method for fabricating 2T-1MTJ spin hall effect STT-MRAM bit cell arrays together with logic process technology is disclosed. Exemplary embodiments of the resulting 2T-1MTJ SHE STT-MRAM bit cell structures and final cross-sectional diagrams are described below in association with FIGS. 2A-2D and 3-5. An exemplary process flow sequence is described below in association with FIGS. 6A-6S. One or more embodiments may include the presence of thin vias connecting a SHE metal to an underlying metallization. One or more embodiments may include patterning the SHE using a damascene process. One or more embodiments may include the implementation of a process flow in which the SHE devices are fabricated before the neighboring metallization in the logic areas.

In accordance with one or more embodiments described herein, advantages of SHE STT-MRAM devices versus traditional STT-MRAM is their ability to achieve high-speed write at lower switching voltage and energy. To provide context, at the present time, state of the art SHE STT-MRAM is still in the research phase where the emphasis is on individual device performance. By contrast, embodiments described herein are directed to the fabrication of area-efficient SHE STT-MRAM bit cell arrays that are embedded into (e.g., fabricated in a same processing scheme as) logic processors.

Figure 1:
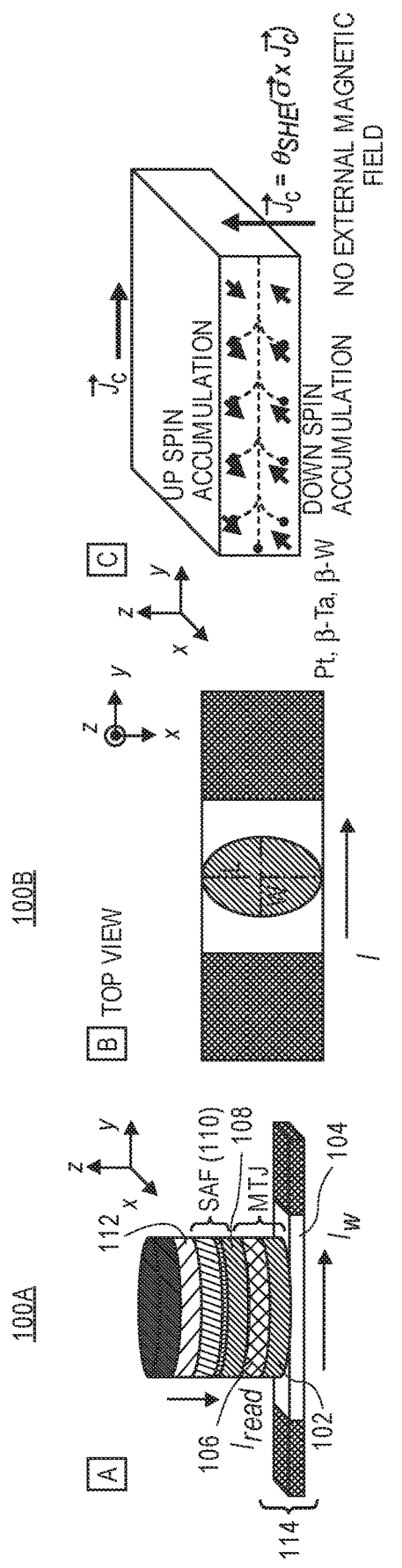
FIG. 1 illustrates the working mechanism of a giant spin Hall Effect magnetic tunnel junction (GSHE-MTJ) device with (a) an illustrated typical material stack for GSHE-MTJ, (b) an illustrated top view of the device of (a), and (c) an illustration depicting direction of the spin currents and charge currents as determined by spin Hall Effect in metals, in accordance with the prior art.

It is to be appreciated that a SHE STT-MRAM bit cell uses a giant spin-hall-effect (SHE) MTJ device to achieve low-energy and low-latency write operation. To exemplify this effect, FIG. 1 shows a three-terminal magnetic tunnel junction (MTJ) memory device with the SHE electrode at the bottom of MTJ. In order to provide context, FIG. 1 is provided to aid with illustration of the operating principle of giant spin hall MRAM. Specifically, FIG. 1 illustrates the working mechanism of a GSHE-MTJ with (a) an illustrated typical material stack 100A for GSHE-MTJ, (b) an illustrated top view 100B of the device of (a), and (c) an illustration depicting direction of the spin currents and charge currents as determined by spin Hall Effect in metals, in accordance with the prior art.

With reference again to FIG. 1, a nominal geometry of a 3-terminal memory cell with a spin Hall Effect induced write mechanism and MTJ based read-out is shown. The nominal material stack 100A includes a free layer nanomagnet 102 in direct contact with GSHE metal 104. The nominal MTJ stack is composed of the free layer 102 (FM1), a magnesium oxide (MgO) tunneling oxide 106, a fixed magnet 108 (FM2) with a synthetic anti-ferro-magnet (SAF) 110 which is CoFe/Ru based, and an anti-ferromagnet (AFM) 112. The SAF layers 110 allows for cancelling the dipole fields around the free layer 102. A wide combination of materials has been studied for this material stacking. For example, the write electrode 114 includes a GSHE metal composed of β-Tantalum (β-Ta), β-Tungsten (β-W), platinum (Pt), Cu doped with Bi, iridium (Ir), tungsten (W), a Ag/Bi bilayer, BiSe, or $MoS_2$. The write electrode 114 transitions into a normal high conductivity metal (e.g., copper (Cu)) to minimize the write electrode resistance. The top view 100B of the device reveals that magnet is oriented along the width of the GSHE electrode for appropriate spin injection.

Referring again to FIG. 1, the magnetic cell is written by applying a charge current via the GSHE electrode. The direction of the magnetic writing is determined by the direction of the applied charge current. Positive currents (along +y) produce a spin injection current with transport direction (along +z) and spins pointing to (+x) direction. The injected spin current in-turn produces spin torque to align the magnet in the +x or −x direction. The transverse spin current for a charge current in the write electrode is provided in equation (1):

$$\vec{I}_s = P_{she}(w, t, \lambda_{sf}, \theta_{SHE})\left(\hat{\sigma} \times \vec{I}_c\right) \quad (1)$$

where $P_{SHE}$ is the spin hall injection efficiency which is the ratio of magnitude of transverse spin current to lateral charge current, w is the width of the magnet, t is the thickness of the GSHE metal electrode, $\lambda_{sf}$ is the spin flip length in the GSHE metal, $\theta_{GSHE}$ is the spin hall angle for the GSHE-metal to FM1 interface. The injected spin angular momentum responsible for spin torque can be determined by first solving equation 1.

In accordance with various embodiments of the present invention, a 2T-1MTJ SHE bit cell is fabricated, examples of different layers of which are described in association with FIGS. 2A-2D. FIG. 2A illustrates a top-down schematic view of a 2T-1MTJ SHE STT-MRAM bit cell highlighting transistor and diffusion contact features, in accordance with an embodiment of the present invention. Referring to FIG. 2A, a structure 200A includes a 2T-1MTJ SHE STT-MRAM bit cell 202. The structure 200A is based on gate lines 204 (also known as poly lines). The 2T-1MTJ SHE STT-MRAM bit cell 202 is included in a region having a width (W) of 2× the pitch of the gate lines 204. A first transistor 206 and a second transistor 208 are shown with gate portions 210 highlighted in the region of the 2T-1MTJ SHE STT-MRAM bit cell 202. Also shown in FIG. 2A are diffusion regions 212 and diffusion contact regions 214.

FIG. 2B illustrates a top-down schematic view of a 2T-1MTJ SHE STT-MRAM bit cell highlighting transistor, diffusion contact, and metal 1 features, in accordance with an embodiment of the present invention. Referring to FIG. 2B, a structure 200B includes the 2T-1MTJ SHE STT-MRAM bit cell 202. A metal 1 layer 216 (also known as M1) includes a first source line A 218, a source line B 220, and a second source line A 222. The metal 1 layer 216 is formed above the structure 200A of FIG. 2A.

FIG. 2C illustrates a top-down schematic view of a 2T-1MTJ SHE STT-MRAM bit cell highlighting transistor, diffusion contact, metal 1, MTJ and spin-hall metal features, in accordance with an embodiment of the present invention. Referring to FIG. 2C, a structure 200C includes the 2T-1MTJ SHE STT-MRAM bit cell 202. A spin-hall metal layer 224 is formed over the 2T-1MTJ SHE STT-MRAM bit cell 202. An MTJ structure 226 is formed over the spin-hall metal layer 224. The spin-hall metal layer 224 and the MTJ structure 226 are formed above the structure 200B of FIG. 2B. In an embodiment, the MTJ structure 226 is formed in a same layer as a metal 2 (M2) layer, as is described in greater detail below in association with FIGS. 3 and 4.

FIG. 2D illustrates a top-down schematic view of a 2T-1MTJ SHE STT-MRAM bit cell highlighting metal 3 and via 2 features, in accordance with an embodiment of the present invention. Referring to FIG. 2D, a structure 200D includes the 2T-1MTJ SHE STT-MRAM bit cell 202. A metal 3 layer 228 (also known as M3) is formed over the structure 200C of FIG. 2C. The metal 3 layer 228, as shown, includes bitlines 230, 232 and 234, where bitline 232 is formed over the MTJ structure 226. In one such embodiment, bitline 232 is coupled to the MTJ structure 226 by a via 2 layer 236, as is depicted in FIG. 2D.

Figure 3:
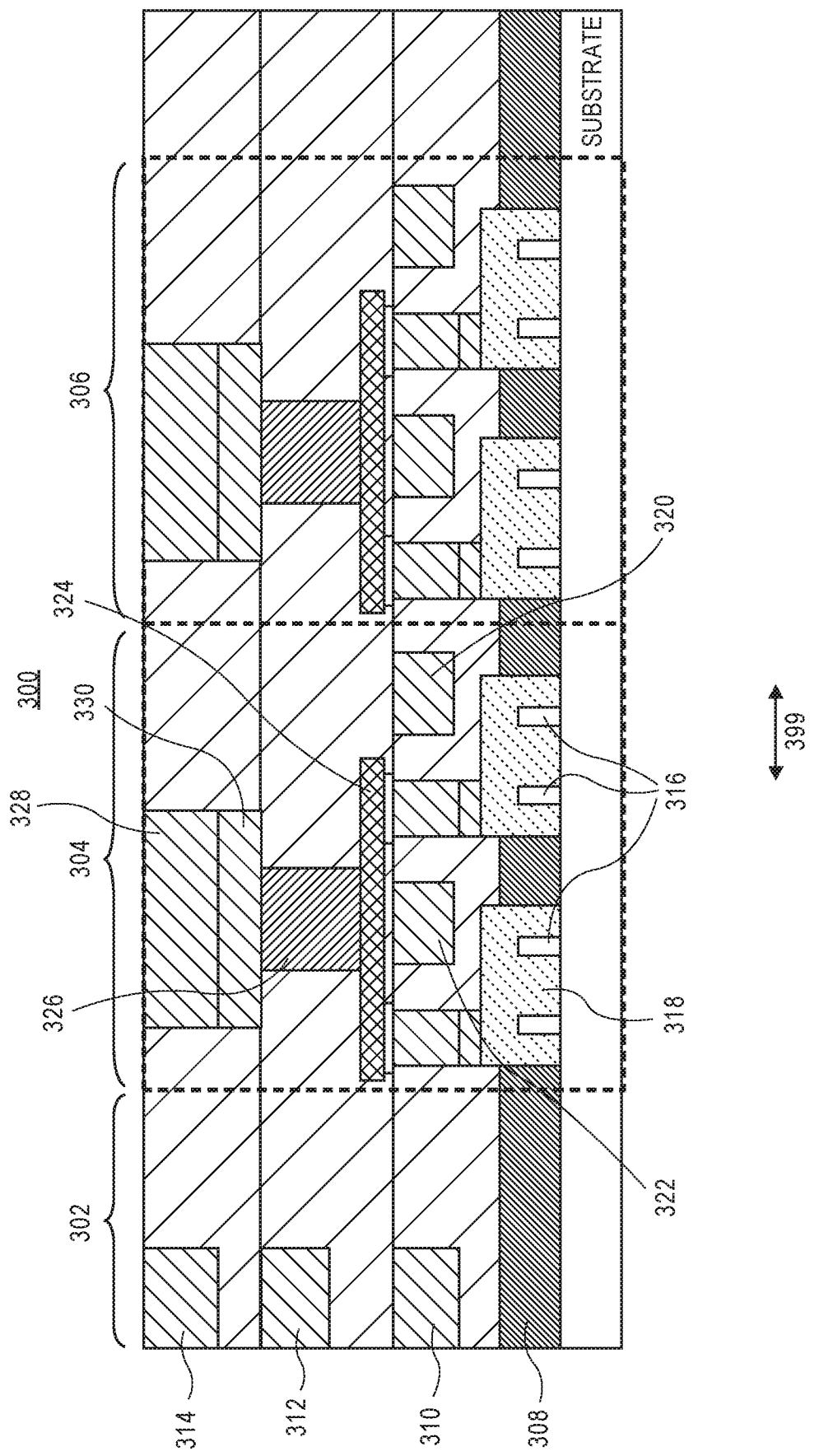
FIG. 3 illustrates a cross-sectional view of two 2T-1MTJ SHE STT-MRAM bit cells in parallel with one another, and parallel to the transistor gate direction (e.g., along direction 399 of FIG. 2D), in accordance with an embodiment of the present invention.

It is to be appreciated that a 2T-1MTJ SHE STT-MRAM bit cell can be fabricated using non-planar transistors, such as fin-FET or tri-gate transistors. As an example, FIG. 3 illustrates a cross-sectional view of two 2T-1MTJ SHE STT-MRAM bit cells in parallel with one another, and parallel to the transistor gate direction (e.g., along direction 399 of FIG. 2D), in accordance with an embodiment of the present invention. Referring to FIG. 3, a structure 300 includes a logic region 302, a first 2T-1MTJ SHE STT-MRAM bit cell region 304, and a second 2T-1MTJ SHE STT-MRAM bit cell region 306. Although no devices are depicted in the logic region 302 as shown, a gate layer 308, a metal 1 (M1) layer 310, a metal 2 (M2) layer 312, and a metal 3 (M3) layer 314 are shown. For each of the 2T-1MTJ SHE STT-MRAM bit cell regions 304 and 306, end portions of fin diffusion regions of semiconductor fins 316 are shown. Diffusion contacts 318 are shown over the fin diffusion regions of semiconductor fins 316. It is to be appreciated that the gate layer 308 continues behind the diffusion contacts 318, as is depicted in FIG. 3.

Referring again to FIG. 3, a source line A 320 and a source line B 322 are above the diffusion contacts 318. A spin-hall metal layer 324 is formed above the source line A 320, the source line B 322 and the diffusion contacts 318, and in particular over the source line B 322. An MTJ stack 326 is formed over the spin-hall metal layer 324. A bitline 328 is over the MTJ stack 326, and is coupled to the MTJ stack 326 by a via 2 layer 330. In an embodiment, the bitline 328 is formed in a metal 3 layer, the MTJ stack is formed in a metal 2 layer, and the source lines 320 and 322 are formed in a metal 1 layer, as is depicted in FIG. 3.

Figure 4:
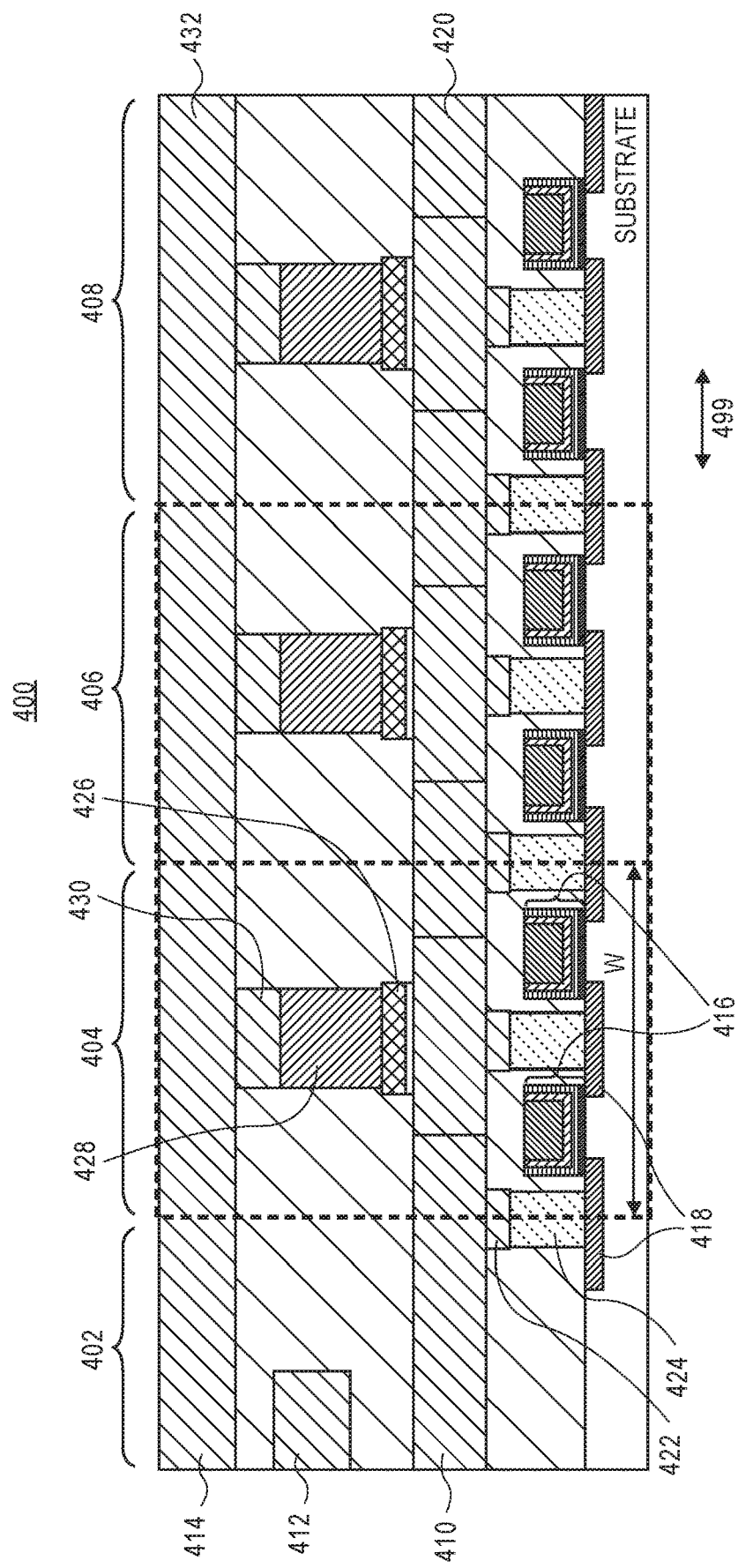
FIG. 4 illustrates a cross-sectional view of three 2T-1MTJ SHE STT-MRAM bit cells in parallel with one another, and orthogonal to the transistor gate direction (e.g., along direction 499 of FIG. 2D), in accordance with an embodiment of the present invention.

FIG. 4 illustrates a cross-sectional view of three 2T-1MTJ SHE STT-MRAM bit cells in parallel with one another, and orthogonal to the transistor gate direction (e.g., along direction 499 of FIG. 2D), in accordance with an embodiment of the present invention. Referring to FIG. 4, a structure 400 includes a logic region 402, a first 2T-1MTJ SHE STT-MRAM bit cell region 404, a second 2T-1MTJ SHE STT-MRAM bit cell region 406, and a third 2T-1MTJ SHE STT-MRAM bit cell region 408. Although no devices are depicted in the logic region 402 as shown, a metal 1 (M1) layer 410, a metal 2 (M2) layer 412, and a metal 3 (M3) layer 414 are shown. For each of the 2T-1MTJ SHE STT-MRAM bit cell regions 404, 406 and 408, W is 2× gate pitch, and two gate electrode stacks 416 of select transistors are shown.

Referring again to FIG. 4, diffusion regions 418 are on either side of each gate electrode stack 416. A source line 420 is over the gate electrode stacks 416 and is formed in a metal 1 layer 410. The source line 420 is coupled to the diffusion regions 418 by a via layer 422 and diffusion contacts 424. A spin-hall metal layer 426, an MTJ structure 428 and a via 2 layer 430 are formed above the source line 420. A bitline 432 is over the spin-hall metal layer 426, an MTJ structure 428 and a via 2 layer 430. The bitline 432 is formed in a metal 3 layer 414.

Referring collectively to FIGS. 2A-2D, 3 and 4, in an embodiment, a source line and a bitline of each bit cell implements metal 1 and metal 3 below and above an MTJ, respectively. A spin-hall metal electrode connects two short metal 1 (M1) stubs below using shallow vias. Each MTJ lands on a SHE electrode and is equally spaced between two shallow vias below the SHE electrode. The dimensions and thickness of the SHE electrode are optimized to achieve high spin injection. Each MTJ is connected to a M3 bitline using a via 2 layer. Each bit cell uses three metal layers. The MTJ and SHE electrode replace the M2 in the SHE STT-MRAM array. Both source lines in each bit cell are below the SHE electrode.

Figure 5:
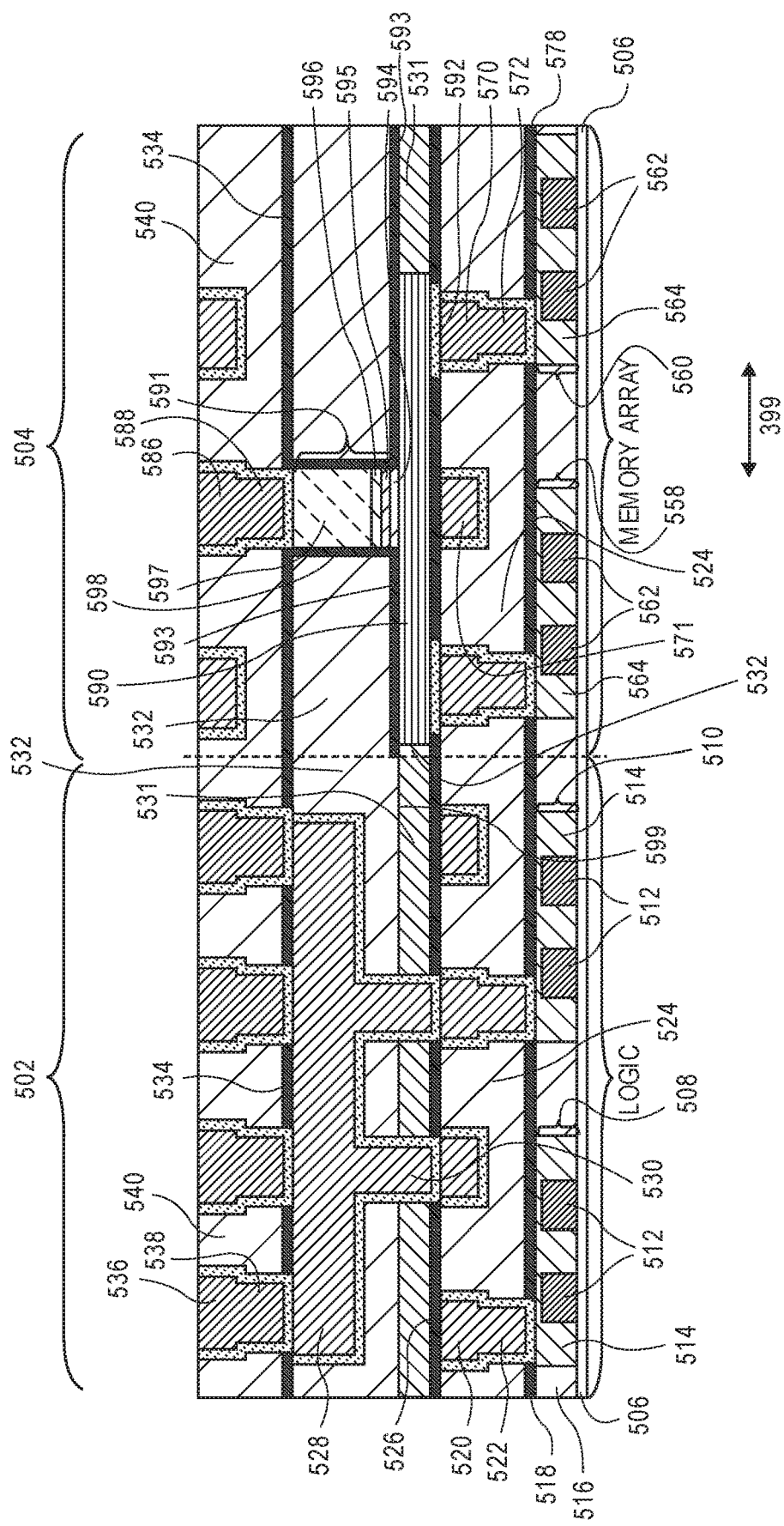
FIG. 5 illustrates a cross-sectional view of logic devices together with a 2T-1MTJ SHE STT-MRAM bit cell parallel to the transistor gate direction (e.g., along direction 399 of FIG. 2D), in accordance with an embodiment of the present invention.

In an embodiment, logic devices are fabricated in a same layer as select transistors for a bit cell providing a 2T-1MTJ SHE MRAM array embedded in a logic chip. As an example, FIG. 5 illustrates a cross-sectional view of logic devices together with a 2T-1MTJ SHE STT-MRAM bit cell parallel to the transistor gate direction (e.g., along direction 399 of FIG. 2D), in accordance with an embodiment of the present invention. Referring to FIG. 5, a structure 500 includes a logic region 502 and a 2T-1MTJ SHE STT-MRAM bit cell region 504.

Referring to the logic region 502 of FIG. 5, two transistors 508 and 510 are disposed above a substrate 506. Each of the transistors 508 and 510 includes two semiconductor fins 512, source or drain (diffusion) ends of which are shown in the cross-sectional view of FIG. 5. As depicted, diffusion contacts 514 are disposed on and couple the two semiconductor fins 512 of each transistor. It is to be appreciated, however, that more than or fewer than two fins may be used to fabricate a transistor of the logic region 502. The transistors 508 and 510 are formed in an inter-layer dielectric layer 516, and an etch stop layer 518 is disposed on the inter-layer dielectric layer 516 and the diffusion contacts 514. Metal 1 (M1) 520 and via 0 (V0) 522 structures are formed in an inter-layer dielectric layer 524 disposed over the etch stop layer 518. An etch stop layer 526 is disposed on the inter-layer dielectric layer 524. Metal 2 (M2) 528 and via 1 (V1) 530 structures are formed in a lower inter-layer dielectric layer 531 and an upper inter-layer dielectric layer 532 disposed over the etch stop layer 526. An etch stop layer 534 is disposed on the upper inter-layer dielectric layer 532. Metal 3 (M3) 536 and via 2 (V2) 538 structures are formed in an inter-layer dielectric layer 540 disposed over the etch stop layer 534.

Referring again to metal 2 (M2) 528 and via 1 (V1) 530, these structure are referred to collectively as a metallization layer. Thus, in an embodiment, the logic processor includes at least one metallization layer in the logic region. In one embodiment, the metallization layer includes a layer of metal lines (e.g., M2, 528) and corresponding vias (e.g., V1, 530) disposed in the lower 531 and upper 532 dielectric layers. In one embodiment, the lower 531 and upper 532 dielectric layers meet at a seam 599 in the metallization layer, as is depicted in FIG. 5. In one embodiment, the vias (e.g., V1, 530) are disposed in both of the lower 531 and upper 532 dielectric layers, and the metal lines (e.g., M2, 528) are disposed only in the upper dielectric layer 532, as is also depicted in FIG. 5.

Referring to the 2T-1MTJ SHE STT-MRAM bit cell region 504 of FIG. 5, two transistors 558 and 560 are disposed above the substrate 506. Each of the transistors 558 and 560 includes two semiconductor fins 562, source or drain (diffusion) ends of which are shown in the cross-sectional view of FIG. 5. As depicted, diffusion contacts 564 are disposed on and couple the two semiconductor fins 562 of each transistor. It is to be appreciated, however, that more than or fewer than two fins may be used to fabricate a transistor of the 2T-1 MTJ SHE STT-MRAM bit cell region 504. The transistors 558 and 560 are formed in the inter-layer dielectric layer 516, and the etch stop layer 578 is disposed on the inter-layer dielectric layer 516 and the diffusion contacts 564. Metal 1 (M1) 570 and via 0 (V0) 572 structures are formed in the inter-layer dielectric layer 524 disposed over the etch stop layer 518. A source line 571 is also formed in the inter-layer dielectric layer 524. The etch stop layer 526 is disposed on the inter-layer dielectric layer 524.

Referring again to the 2T-1MTJ SHE STT-MRAM bit cell region 504 of FIG. 5, a spin-hall metal layer 590 is formed in the lower inter-layer dielectric layer 531 disposed over the etch stop layer 526. An MTJ stack 591 is formed in the upper inter-layer dielectric layer 532 disposed over the lower inter-layer dielectric layer 531. The spin-hall metal layer 590 may be coupled to the Metal 1 (M1) 570 structures by a conductive layer 592, such as a tantalum nitride (TaN) layer, as is depicted in FIG. 5. An etch stop layer 593 may be formed on the spin-hall metal layer 590, as is also depicted in FIG. 5. The MTJ stack 591 may include a free layer MTJ film or films 594, a dielectric or tunneling layer 595, a fixed layer MTJ film or films 596, and a top electrode 597, as is depicted in FIG. 5. Additionally, a dielectric spacer layer 598 may be included along the sidewalls of the MTJ stack 591, as is also depicted in FIG. 5. In an embodiment, the conductive layer 592 in the opening of the first etch stop layer serves as a barrier to prevent diffusion of the conductive layer 570 below.

Thus, referring again to the 2T-1MTJ SHE STT-MRAM bit cell region 504 of FIG. 5, the spin hall effect electrodes 590 of the 2T-1MTJ SHE electrode bit cells are disposed in the lower dielectric layer 531 laterally adjacent to the metallization layer 528/530 of the logic region. The MTJs of the 2T-1MTJ SHE electrode bit cells are disposed in the upper dielectric layer 532 laterally adjacent to the metallization layer 528/530 of the logic region.

In an embodiment, the memory array includes an insulating spacer layer (collectively 598 and 593) disposed adjacent to sidewalls of the MTJs 591 of the 2T-1MTJ SHE electrode bit cells and across a top surface of the spin hall effect electrodes 590 of the 2T-1MTJ SHE electrode bit cells. In one embodiment, the insulating spacer layer 598/593 extends across a top surface of the lower dielectric layer 531, as is depicted in FIG. 5. In one embodiment, a top surface of the spin hall effect electrodes 590 of the 2T-1MTJ SHE electrode bit cells is co-planar with a top surface of the lower dielectric layer 531, as is also depicted in FIG. 5.

Referring again to the 2T-1MTJ SHE STT-MRAM bit cell region 504 of FIG. 5, the etch stop layer 534 is disposed on the upper inter-layer dielectric layer 532. Metal 3 (M3) 586 and via 2 (V2) 588 structures, which may form portions of bitlines, are formed in the inter-layer dielectric layer 540 disposed over the etch stop layer 534. It is to be appreciated that additional interconnect layer(s) may be formed on top of the M3/V2 layers of FIG. 5, e.g., using standard dual damascene process techniques that are well-known in the art.

Referring again to FIG. 5, in an embodiment, the spin-hall metal layer 590 is composed of a metal such as, but not limited to, $\beta$-Tantalum ($\beta$-Ta), $\beta$-Tungsten ($\beta$-W), platinum (Pt), Cu doped with Bi, iridium (Ir), tungsten (W), a Ag/Bi bilayer, BiSe, or $MoS_2$, where the spin-hall metal layer 590 is in contact with the corresponding MTJ stack 591. In one embodiment, the spin-hall metal layer 590 is a layer of uniform composition. In another embodiment, the spin-hall metal layer 590 transitions into a normal high conductivity metal (e.g., copper (Cu)) on either end of the layer 590.

Referring again to FIG. 5, in an embodiment, the free layer MTJ film or films 594 is composed of a material suitable for transitioning between a majority spin and a minority spin, depending on the application. Thus, the free magnetic layer (or memory layer) may be referred to as a ferromagnetic memory layer. In one embodiment, the free magnetic layer is composed of a layer of cobalt iron (CoFe) or cobalt iron boron (CoFeB).

Referring again to FIG. 5, in an embodiment, the dielectric or tunneling layer 595 is composed of a material suitable for allowing current of a majority spin to pass through the layer, while impeding at least to some extent current of a minority spin to pass through the layer. Thus, the dielectric or tunneling layer 595 (or spin filter layer) may be referred to as a tunneling layer. In one embodiment, the dielectric layer is composed of a material such as, but not limited to, magnesium oxide (MgO) or aluminum oxide ($Al_2O_3$). In one embodiment, the dielectric layer has a thickness of approximately 1 nanometer.

Referring again to FIG. 5, in an embodiment, the fixed layer MTJ film or films 596 is composed of a material or stack of materials suitable for maintaining a fixed majority spin. Thus, the fixed magnetic layer (or reference layer) may be referred to as a ferromagnetic layer. In one embodiment, the fixed magnetic layer is composed of a single layer of cobalt iron boron (CoFeB). However, in another embodiment, the fixed magnetic layer is composed of a cobalt iron boron (CoFeB) layer, ruthenium (Ru) layer, cobalt iron boron (CoFeB) layer stack. In an embodiment, although not depicted, a synthetic antiferromagnet (SAF) is disposed on or adjacent to the fixed layer MTJ film or films 596.

Referring again to FIG. 5, in an embodiment, the top electrode 597 is composed of a material or stack of materials suitable for electrically contacting the fixed layer MTJ film or films 596. In an embodiment, the top electrode 597 is a topographically smooth electrode. In one such embodiment, the top electrode 597 has a thickness suitable for good conductivity but has little to no columnar structure formation that would otherwise lead to a rough top surface. Such a topographically smooth electrode may be referred to as amorphous in structure. In a specific embodiment, the top electrode 597 is composed of Ru layers interleaved with Ta layers. Effectively, in accordance with an embodiment of the present invention, the top electrode 597 may not be not a conventional thick single metal electrode, such as a Ru electrode, but is instead a Ru/Ta interleaved materials stack. In alternative embodiments, however, the top electrode 597 is a conventional thick single metal electrode, such as a Ru electrode.

Referring again to FIG. 5, in an embodiment, substrate 506 is a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

Referring again to FIG. 5, in an embodiment, transistors 508, 510, 558 and 560 are metal-oxide-semiconductor field-effect transistors (MOSFET or simply MOS transistors), fabricated on the substrate 506. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only fin-FET transistors, it should be noted that the invention may also be carried out using planar transistors.

Although not depicted in FIG. 5, but can be seen from the cross-sectional view of FIG. 4, in an embodiment, each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

Referring again to FIG. 5, in an embodiment, one or more interlayer dielectrics (ILD), such as inter-layer dielectric material layer 516 and other inter-layer dielectric layers, are deposited over the MOS transistors 508, 510, 558 and 560. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organo-silicate glass. The ILD layers may include pores or air gaps to further reduce their dielectric constant.

Referring again to FIG. 5, in an embodiment, the metal lines (such as M1, M2, and M3) and vias (such as V0, V1, V2) are composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

Referring again to FIG. 5, in an embodiment, etch stop materials are composed of dielectric materials different from the interlayer dielectric material. In some embodiments, an etch stop layer includes a layer of a nitride of silicon (e.g., silicon nitride) or a layer of an oxide of silicon, or both, or a combination thereof. Other suitable materials may include carbon-based materials, such as silicon carbide. Alternatively, other etch stop layers known in the art may be used depending upon the particular implementation. The etch stop layers may be formed by CVD, PVD, or by other deposition methods.

A shared fabrication scheme may be implemented to embedding 2T-1MTJ Spin Hall Effect (SHE) STT-MRAM bit cell arrays into a logic process technology. As an exemplary processing scheme, FIGS. 6A-6S illustrate cross-sectional views representing various processing operations in a method of fabricating logic regions together with 2T-1MTJ SHE STT-MRAM bit cell arrays on a common substrate, in accordance with an embodiment of the present invention.

Figure 6A:
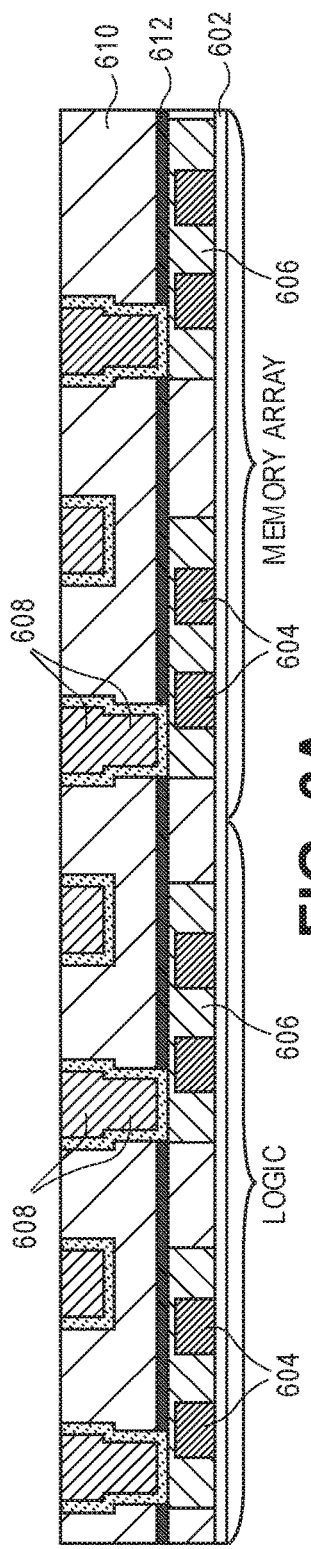

Referring to FIG. 6A, the fabrication approach begins with a substrate 602 that has completed transistor fins 604 and diffusion contacts 606 attached to the source and drain regions of the transistor fins 604 (gate structure fabrication is complete as well, but not depicted as gate structure would be formed into the page with respect to FIG. 6A. M1/V0 metallization 608 is formed in an inter-layer dielectric layer 610 above an etch stop layer 612. The transistor fins 604, diffusion contacts 606 and M1/V0 metallization 608 are fabricated using methods and techniques that are well-known in the art. The partially completed device wafer is then processed through the following operations described in association with FIGS. 6B-6S. Logic regions and memory array regions are designated throughout.

Figure 6B:
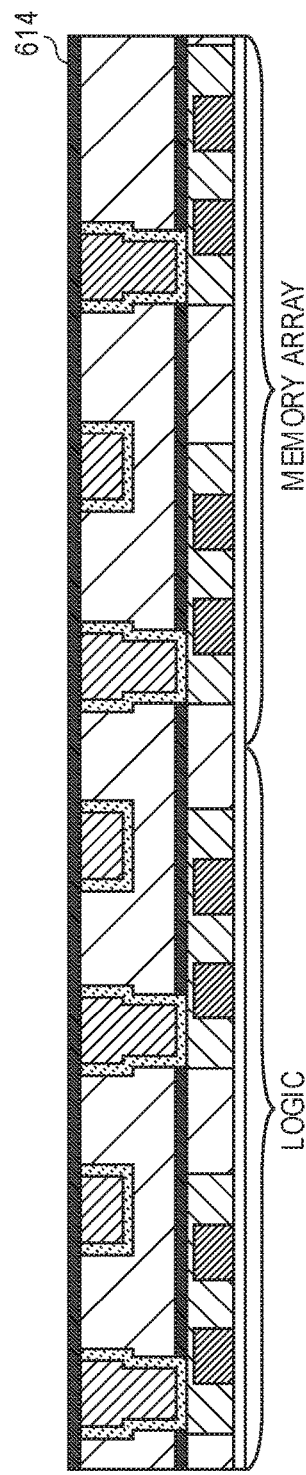
FIG. 6B illustrates the structure of FIG. 6A following formation of an etch stop layer.

Referring to FIG. 6B, an etch stop layer 614 is formed over the structure of FIG. 6A. In an embodiment, the etch stop layer 614 is composed of silicon nitride, silicon carbide, or silicon oxynitride.

Figure 6C:
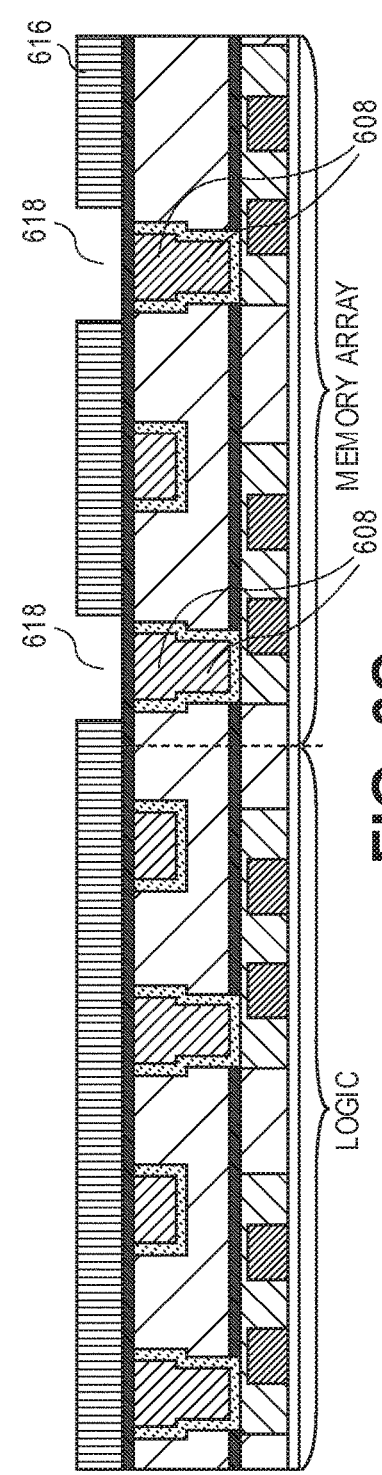
FIG. 6C illustrates the structure of FIG. 6B following formation and patterning of a photoresist layer.

Referring to FIG. 6C, a photoresist layer 616 is formed and patterned over the structure of FIG. 6B. In an embodiment, after patterning, there are holes 618 in the photoresist layer 616 in locations where thin vias will ultimately connect a SHE metal to an underlying M1 metallization 608. The photoresist layer 616 may include other patterning materials such as anti-reflective coatings (ARC's) and gap-fill and planarizing materials in addition to or in place of a photoresist material.

Figure 6D:
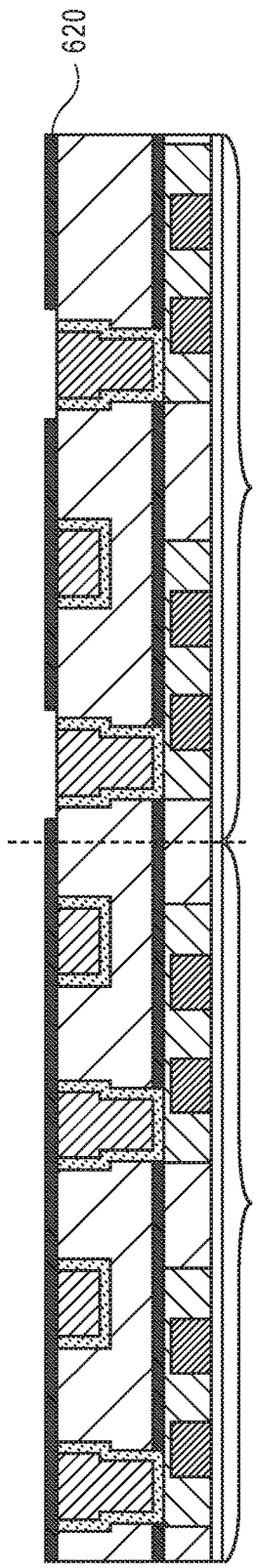
FIG. 6D illustrates the structure of FIG. 6C following an anisotropic dry etch process used to transfer the resist pattern into the etch stop layer.

Referring to FIG. 6D, an anisotropic dry etch process is then used to transfer the resist pattern of the structure of FIG. 6C into the etch stop layer 612 to form a patterned etch stop layer 620. In an embodiment, any remaining resist 616 is removed using a plasma ash process and a cleans process may be used to remove any post-ash residue.

Figure 6E:
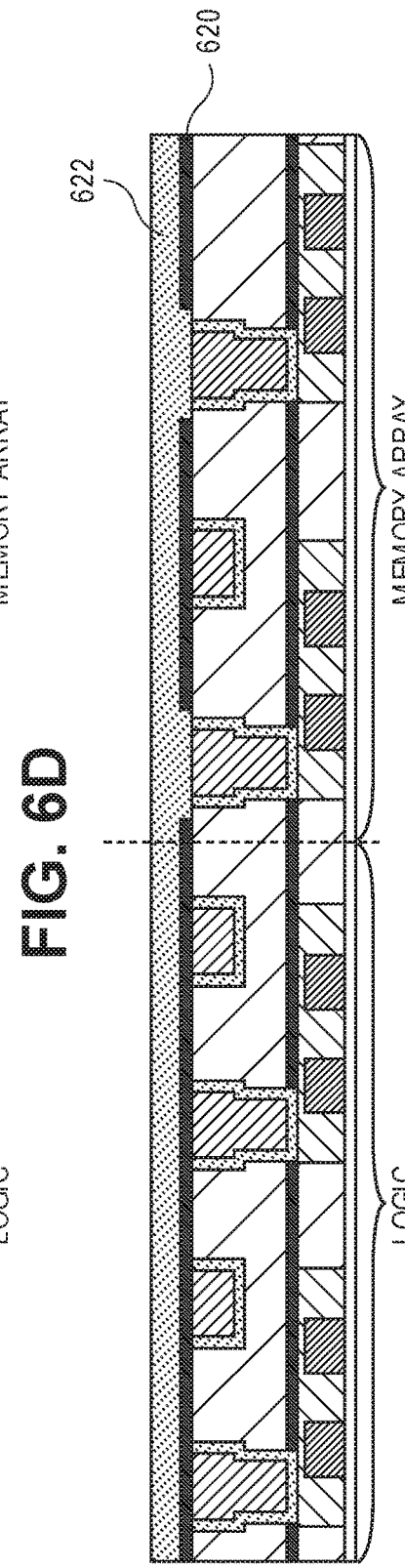
FIG. 6E illustrates the structure of FIG. 6D following formation of a conductive metal layer.

Referring to FIG. 6E, a conductive metal layer 622 is formed over the structure of FIG. 6D. In an embodiment, the conductive metal layer 622 is deposited onto the entire wafer surface, filling into the thin via openings and covering the entire wafer surface. Suitable materials for the conductive metal layer 622 may include titanium, tantalum, titanium nitride, tantalum nitride, ruthenium, titanium-zirconium nitride, cobalt, etc.

Figure 6F:
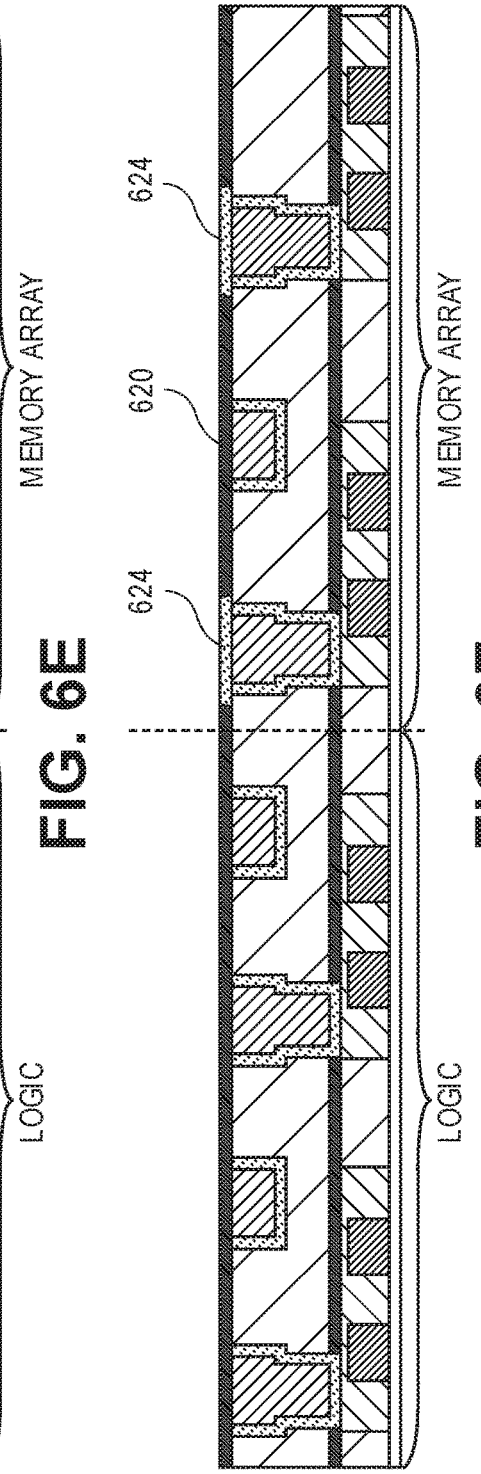
FIG. 6F illustrates the structure of FIG. 6E following planarization to remove conductive metal overburden of the conductive metal layer.

Referring to FIG. 6F, the structure of FIG. 6E is planarized to remove conductive metal overburden of the conductive metal layer 622 using a chemical mechanical planarization (CMP) process, stopping on the underlying etch stop material 620, and leaving a metal layer 624 in openings of the patterned etch stop layer 620. Accordingly, after the CMP process is completed, conductive metal remains in the thin via openings but is completely removed from the remaining surface of the wafer. In an embodiment, the metal layer 624 contacts the underlying M1 metallization 608 on the Memory Array region, as is depicted in FIG. 6F.

Referring to FIG. 6G, a lower interlayer dielectric (ILD) layer 626 is deposited over the structure of FIG. 6F. In an embodiment, the lower ILD layer 626 is formed to a thickness value suitable for forming a spin-hall electrode in the Memory Array areas. Suitable ILD materials may include an ILD material known in the art and having properties suitable for use in the logic circuits in the interconnect layer at hand, such as silicon oxide, SiOF, and carbon-doped oxide. In one embodiment, the ILD material is deposited using CVD processes.

Referring to FIG. 6H, a photoresist layer 628 is applied to the wafer surface and patterned over the structure of FIG. 6G. In an embodiment, after patterning photoresist layer 628 has an opening 630 where an SHE metal line will ultimately be formed by a damascene process. The photoresist layer 628 may include other patterning materials such as anti-reflective coatings (ARC's) and gap-fill and planarizing materials in addition to or in place of a photoresist material.

Referring to FIG. 6I, an anisotropic dry etch process is then used to transfer the resist pattern 628 of the structure of FIG. 6H into the lower ILD layer 626 to form patterned lower ILD layer 632 having opening 634 transferred from the image of opening 630, stopping on the underlying etch stop layer 620. In an embodiment, the opening 634 exposes metal layer 624, as is depicted in FIG. 6I. In an embodiment, any remaining resist is removed using a plasma ash process, and a cleans process may be used to remove any post-ash residue.

Referring to FIG. 6J, a spin hall effect metal layer 636 is formed over the structure of FIG. 6I. In an embodiment, the spin hall effect metal layer 636 is deposited onto the entire wafer surface, filling into the opening 634 of patterned lower dielectric layer 632 and covering the entire wafer surface. Suitable materials for the spin hall effect metal layer 636 may include one or more of β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling, Cu doped with Bi, iridium (Ir), tungsten (W), a Ag/Bi bilayer, BiSe, or $MoS_2$.

Referring to FIG. 6K, the structure of FIG. 6J is planarized to remove overburden of the spin hall effect metal layer 636 using a chemical mechanical planarization (CMP) process, stopping on the patterned lower ILD layer 632. The CMP process leaves a damascene-patterned spin hall effect metal layer 638 in the patterned lower ILD layer 632. Accordingly, after the CMP process is completed, damascene-patterned spin hall effect metal layer 638 remains in patterned lower ILD layer 632 but is completely removed from the remaining surface of the wafer. In an embodiment, the damascene-patterned spin hall effect metal layer 638 is in electrical contact with the metal layer 624, as is depicted in FIG. 6I.

Referring to FIG. 6L, MTJ free layer film(s) 640, tunnel barrier material 642, MTJ fixed layer film(s) 644, and MTJ hard mask metallization films 646 are formed over the structure of FIG. 6K. In an embodiment, such layers are deposited onto the wafer using PVD, ALD, or CVD deposition techniques. The MTJ free layer film(s), tunnel barrier material, MTJ fixed layer film(s), and MTJ hard mask metallization films (e.g., upper electrode materials) may be composed of materials such as those described above.

Referring to FIG. 6M, a photoresist layer 648 is applied to the wafer surface and patterned over the structure of FIG. 6L. In an embodiment, after patterning photoresist layer 648 remains where MTJ stacks are to be located. The photoresist layer 648 may include other patterning materials such as anti-reflective coatings (ARC's) and gap-fill and planarizing materials in addition to or in place of a photoresist material.

Referring to FIG. 6N, portions of the MTJ hardmask (upper electrode) 646, the MTJ fixed layer film(s) 644, the tunnel barrier material 642, and the MTJ free layer film(s) 640 that are not covered with the resist 648 of the structure of FIG. 6M are patterned to form an MTJ stack 650. In an embodiment, these layers are etched using RIE dry etch techniques known in the art, stopping on the patterned spin hall effect metal layer 638. In one embodiment, prior to breaking vacuum in an etch chamber, the wafer surface is covered with a polish-stop material layer 652, such as a silicon nitride layer or a silicon carbide layer. The polish-stop material layer 652 may serve two functions: (1) to protect the etched sidewalls of the MTJ layer film(s) 644, the tunnel barrier material 642, and the MTJ free layer film(s) 642 from oxidation/corrosion and (2) to function as a polish stop during the subsequent ILD polish operation described below.

Referring to FIG. 6O, a photoresist layer 654 is applied to the wafer surface and patterned. In an embodiment, after patterning photoresist 652 remains only on the Memory Array region. The photoresist layer 654 may include other patterning materials such as anti-reflective coatings (ARC's) and gap-fill and planarizing materials in addition to or in place of a photoresist material.

Referring to FIG. 6P, an anisotropic dry etch process is then used to transfer the resist pattern 654 of the structure of FIG. 6O into the polish-stop material layer 652 to form patterned polish-stop material layer 656. The patterned polish-stop material layer 656 may be referred to more generally as a patterned insulating layer formed over the MTJ stack 650 and on the patterned spin hall effect metal layer 638 and on Memory Array regions of the patterned lower ILD layer 632. The dry etching removes the insulating material from the Logic region, as is depicted in FIG. 6P. The anisotropic dry etch process stops on the underlying patterned lower ILD layer 632. In an embodiment, any remaining resist is removed using a plasma ash process, and a cleans process may be used to remove any post-ash residue.

Figure 6Q:
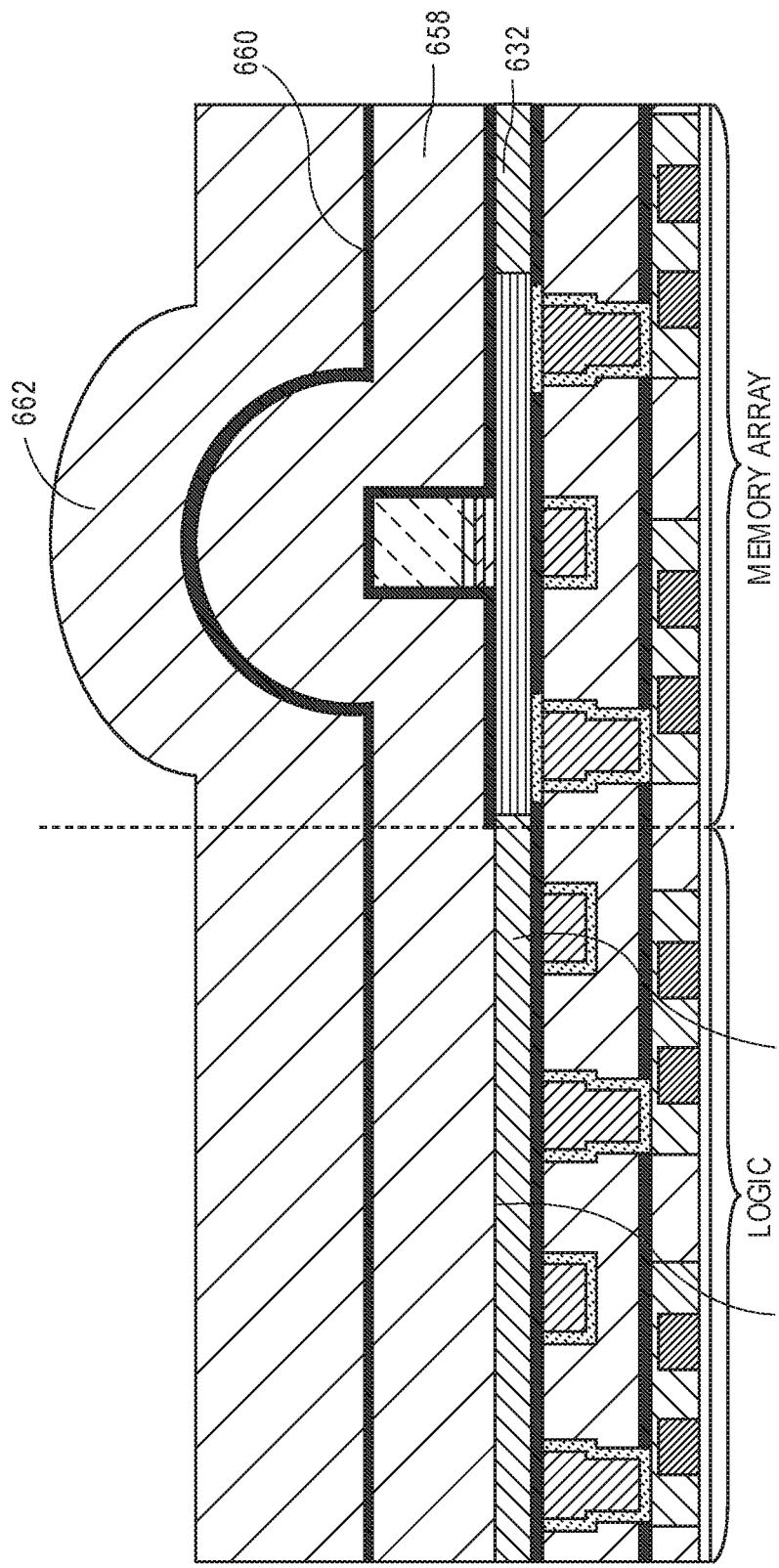
FIG. 6Q illustrates the structure of FIG. 6P following formation of an upper interlayer dielectric (ILD) layer.

Referring to FIG. 6Q, an upper interlayer dielectric (ILD) layer 658 is deposited over the structure of FIG. 6P. In an embodiment, the ILD layer 658 is formed to a thickness value that, when combined with the thickness of the patterned lower ILD layer 632, is suitable for forming a regular interconnect structure in the logic circuit areas. Subsequently, a polish stop layer 660 and additional ILD material 662 are formed. Suitable ILD materials may include an ILD material known in the art and having properties suitable for use in the logic circuits in the interconnect layer at hand, such as silicon oxide, SiOF, and carbon-doped oxide. Suitable polish stop materials include silicon nitride, silicon carbide, silicon oxynitride and carbon-doped silicon oxynitride. In one embodiment, the ILD and polish stop materials are deposited using CVD processes. In an embodiment, a seam 664 between patterned ILD layer 632 and upper ILD layer 658 is prevalent, as is depicted in FIG. 6Q.

Figure 6R:
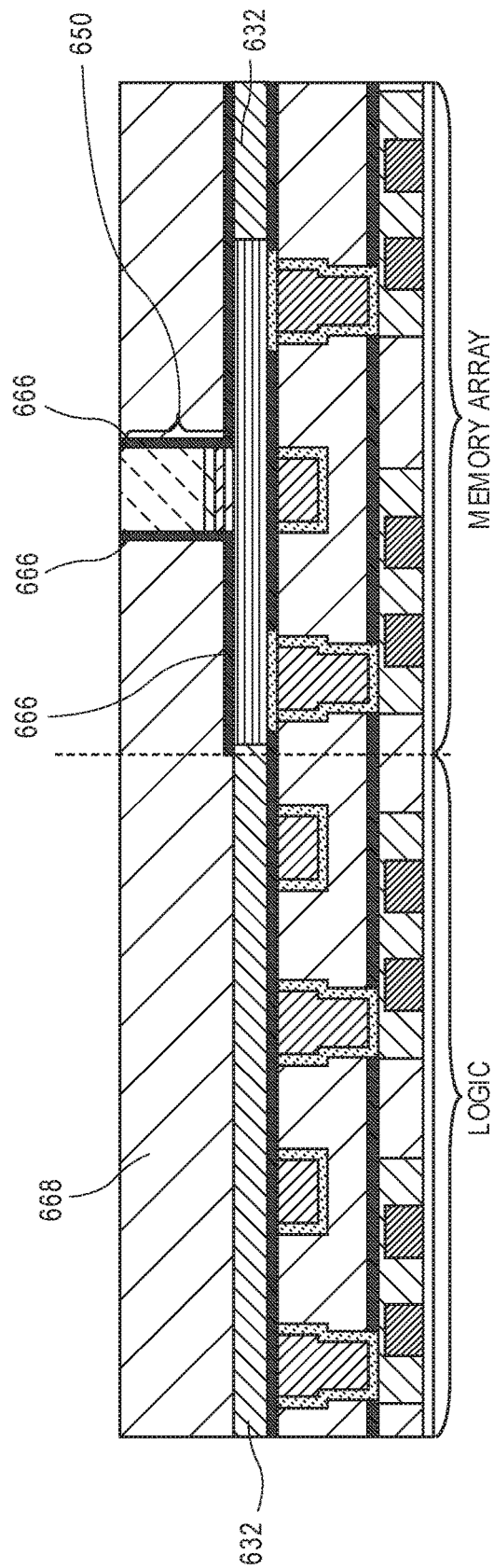
FIG. 6R illustrates the structure of FIG. 6Q following planarization.
Figure 6S:
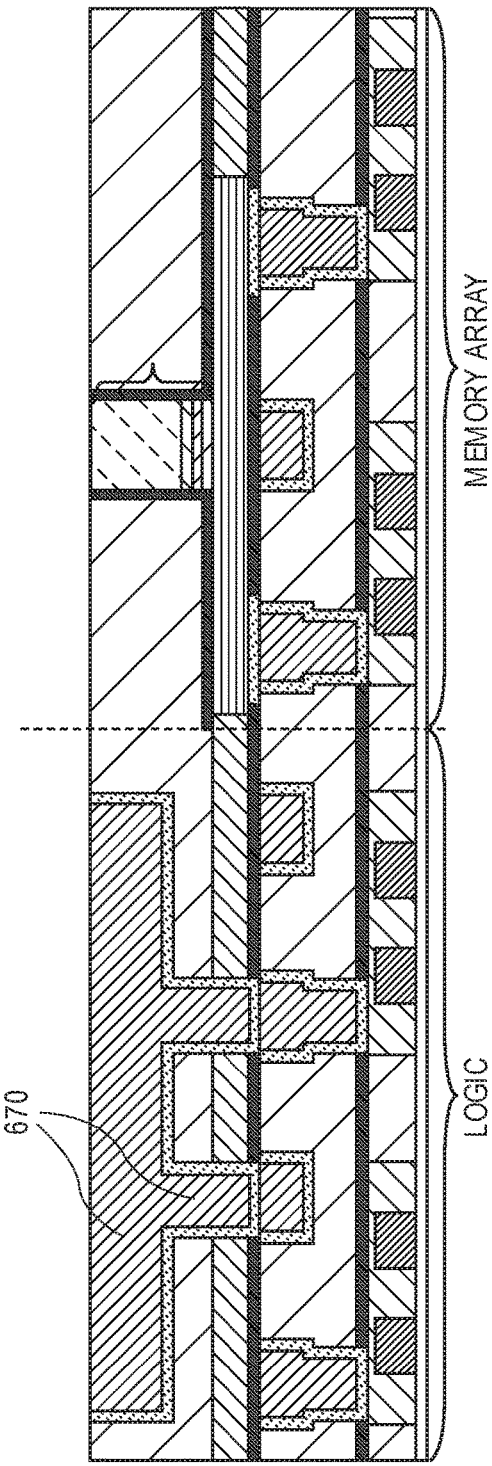

Referring to FIG. 6R, the material layers formed in the operation described in association with FIG. 6Q are planarized using CMP techniques. In one embodiment, the CMP process initially stops on the polish stop layer 660 and on the patterned polish-stop material layer 656, the upper portion of which is then removed during the final portion of the CMP processing to form sidewall insulating layer 666 and planarized upper ILD layer 668, and to expose the uppermost portion of the MTJ stack 650. It is to be appreciated that the sidewall insulating layer 666 continues to extend across the patterned ILD layer 632 and the damascene-patterned spin hall effect metal layer 638 in the Memory Array region, as is depicted in FIG. 6R.

Referring to FIG. 6S, M2/V1 copper interconnect structures 670 are formed in the logic areas of the structure of FIG. 6R. The M2/V1 copper interconnect structures 670 may be fabricated using dual damascene barrier/seed deposition and copper electroplate and copper CMP processes.

Referring again now to FIG. 5, additional processing of the structure of FIG. 6S may include fabrication of M3/V2 copper interconnect structures in the logic and array areas. As described in association with FIG. 5, additional interconnect layer(s) may be formed on top of the M3/V2 layers of FIG. 5, e.g., using standard dual damascene process techniques that are well-known in the art.

Although the above method of fabricating a 2T-1MTJ SHE MRAM array embedded in a logic chip has been described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication.

It is also to be appreciate that in certain aspects and at least some embodiments of the present invention, certain terms hold certain definable meanings. For example, a "free" magnetic layer is a magnetic layer storing a computational variable. A "fixed" magnetic layer is a magnetic layer with fixed magnetization (magnetically harder than the free magnetic layer). A tunneling barrier, such as a tunneling dielectric or tunneling oxide, is one located between free and fixed magnetic layers. A fixed magnetic layer may be patterned to create inputs and outputs to an associated circuit. Magnetization may be written by Spin Hall Effect. Magnetization may be read via the tunneling magneto-resistance effect while applying a voltage. In an embodiment, the role of the dielectric layer is to cause a large magneto-resistance ratio. The magneto-resistance is the ratio of the difference between resistances when the two ferromagnetic layers have antiparallel magnetizations and the resistance of the state with the parallel magnetizations.

In an embodiment, the MTJ functions essentially as a resistor, where the resistance of an electrical path through the MTJ may exist in two resistive states, either "high" or "low," depending on the direction or orientation of magnetization in the free magnetic layer and in the fixed magnetic layer. In the case that the spin direction is of minority in the free magnetic layer, a high resistive state exists, wherein direction of magnetization in the free magnetic layer and the fixed magnetic layer are substantially opposed or antiparallel with one another. In the case that the spin direction is of majority in the free magnetic layer, a low resistive state exists, wherein the direction of magnetization in the free magnetic layer and the fixed magnetic layer is substantially aligned or parallel with one another. It is to be understood that the terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

Thus, the MTJ may store a single bit of information ("0" or "1") by its state of magnetization. The information stored in the MTJ is sensed by driving a current through the MTJ. The free magnetic layer does not require power to retain its magnetic orientations. As such, the state of the MTJ is preserved when power to the device is removed. Therefore, a memory bit cell such as depicted in FIG. 5 is, in an embodiment, non-volatile.

Relating to one or more embodiments described herein, it is to be appreciated that traditional DRAM memory is facing severe scaling issues and, so, other types of memory devices are being actively explored in the electronics industry. One future contender is SHE STT-MRAM devices. Embodiments described herein include a fabrication method for embedding 2T-1MTJ Spin Hall Effect (SHE) STT-MRAM bit cell arrays into a logic process technology. Embodiments described may be advantageous for processing schemes involving the fabrication of logic processors with embedded memory arrays.

Figure 7:
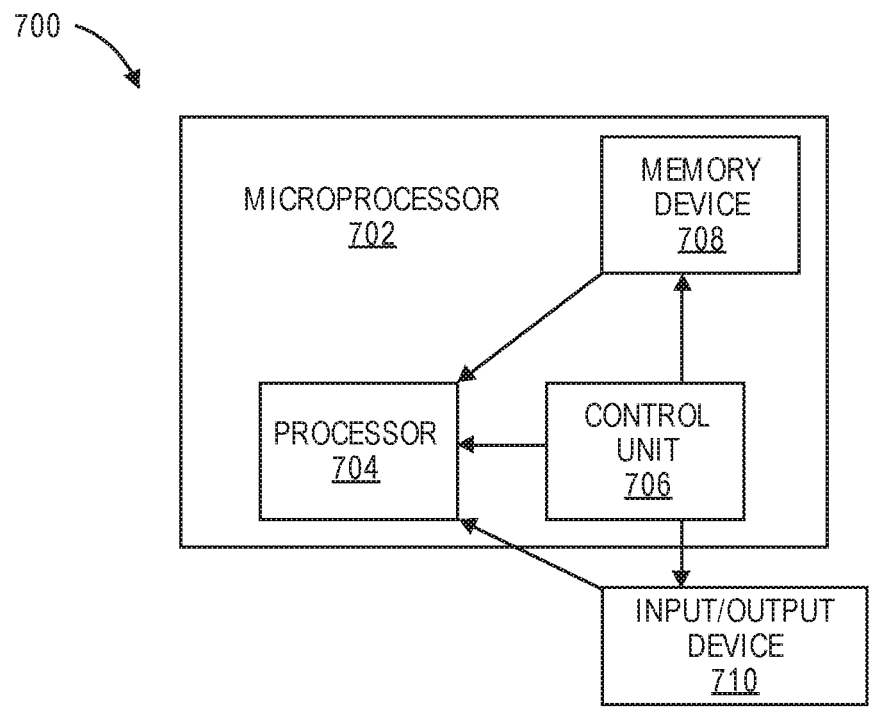
FIG. 7 illustrates a block diagram of an electronic system, in accordance with an embodiment of the present invention.

FIG. 7 illustrates a block diagram of an electronic system 700, in accordance with an embodiment of the present invention. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be understood that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a 2T-1MTJ SHE STT-MRAM bit cell, as described herein. In an embodiment, the memory device 708 is embedded in the microprocessor 702, as depicted in FIG. 7.

Figure 8:
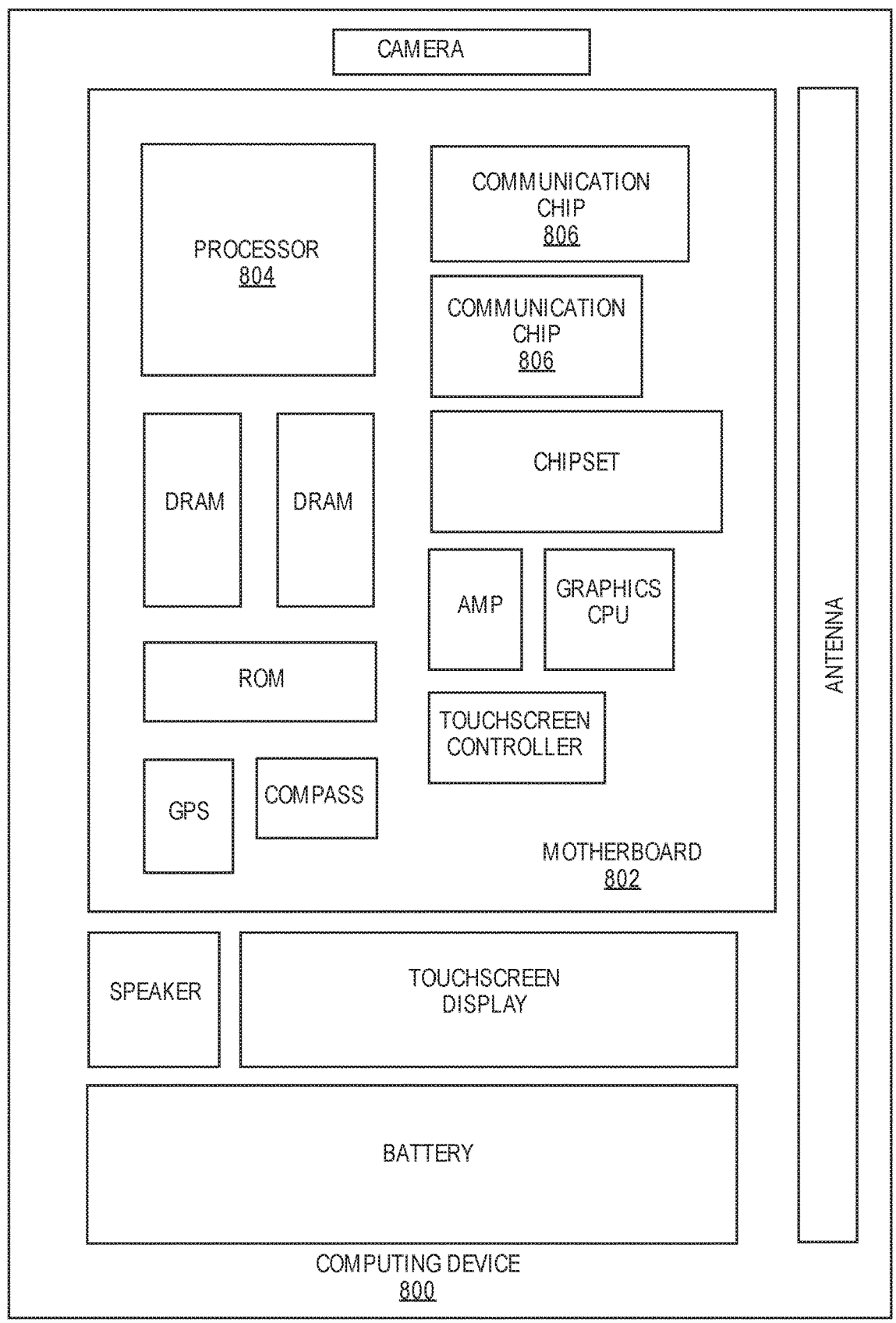
FIG. 8 illustrates a computing device in accordance with one embodiment of the invention.

FIG. 8 illustrates a computing device 800 in accordance with one embodiment of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more arrays, such as arrays based on a 2T-1MTJ SHE STT-MRAM bit cell, built in accordance with embodiments of the present invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more arrays, such as arrays based on a 2T-1MTJ SHE STT-MRAM bit cell, built in accordance with embodiments of the present invention.

In further implementations, another component housed within the computing device 800 may contain a stand-alone integrated circuit memory die that includes one or more arrays, such as arrays based on a 2T-1MTJ SHE STT-MRAM bit cell, built in accordance with embodiments of the present invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Accordingly, one or more embodiments of the present invention relate generally to the fabrication of embedded microelectronic memory. The microelectronic memory may be non-volatile, wherein the memory can retain stored information even when not powered. One or more embodiments of the present invention relate to the fabrication of arrays based on a 2T-1MTJ SHE STT-MRAM bit cell. Such an array may be used in an embedded non-volatile memory, either for its non-volatility, or as a replacement for embedded dynamic random access memory (eDRAM). For example, such an array may be used for 2T-1X memory (X=capacitor or resistor) at competitive cell sizes within a given technology node.

Figure 9:
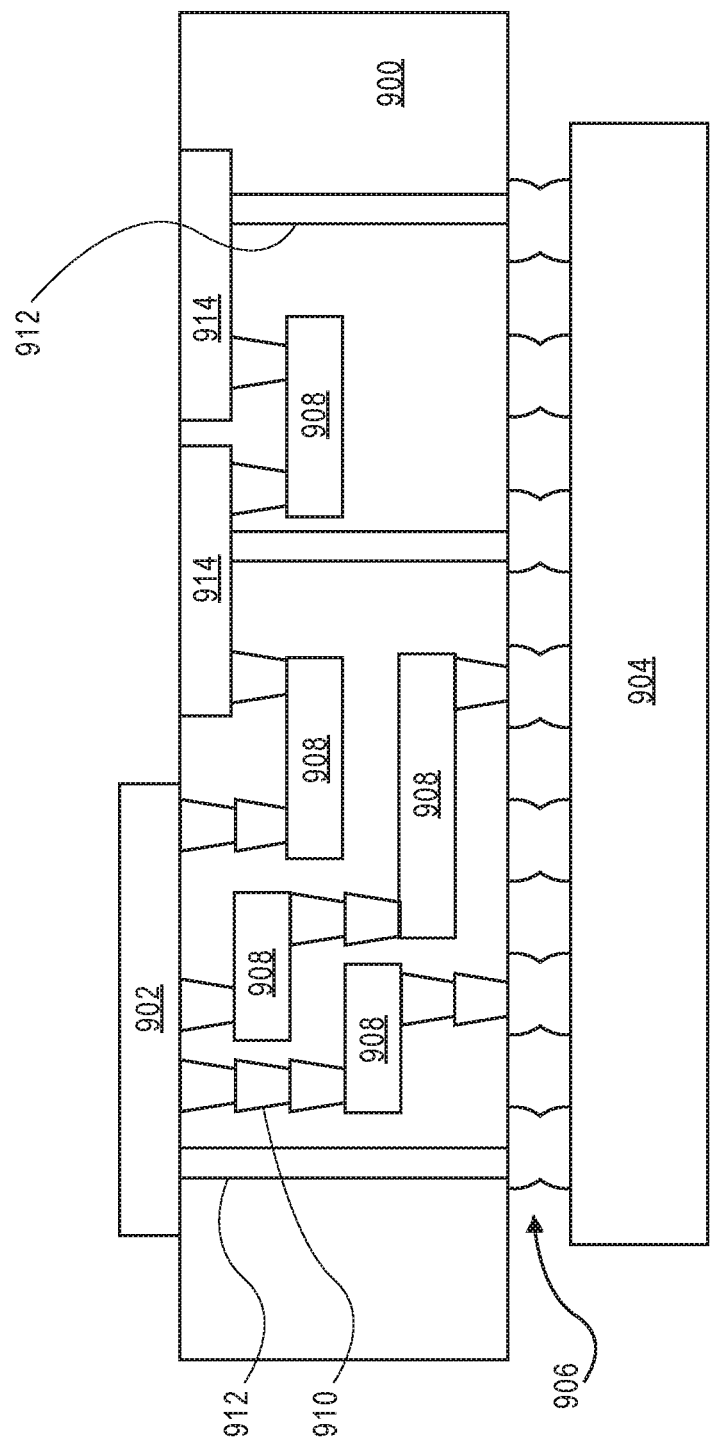
FIG. 9 illustrates an interposer that includes one or more embodiments of the invention.

FIG. 9 illustrates an interposer 900 that includes one or more embodiments of the invention. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the invention, apparatuses or processes disclosed herein may be used in the fabrication of interposer 900.

Thus, embodiments of the present invention include damascene-based approaches for embedding spin hall MTJ devices into a logic processor, and the resulting structures.

In an embodiment, a logic processor includes a logic region including a metallization layer. The logic processor also includes a memory array including a plurality of two-transistor one magnetic tunnel junction (MTJ) spin hall effect electrode (2T-1MTJ SHE electrode) bit cells. The spin hall effect electrodes of the 2T-1MTJ SHE electrode bit cells are disposed in a lower dielectric layer laterally adjacent to the metallization layer of the logic region. The MTJs of the 2T-1MTJ SHE electrode bit cells are disposed in an upper dielectric layer laterally adjacent to the metallization layer of the logic region.

In one embodiment, the memory array includes an insulating spacer layer disposed adjacent to sidewalls of the MTJs of the 2T-1MTJ SHE electrode bit cells and across a top surface of the spin hall effect electrodes of the 2T-1MTJ SHE electrode bit cells.

In one embodiment, the insulating spacer layer extends across a top surface of the lower dielectric layer.

In one embodiment, a top surface of the spin hall effect electrodes of the 2T-1MTJ SHE electrode bit cells is coplanar with a top surface of the lower dielectric layer.

In one embodiment, the metallization layer includes a layer of metal lines and corresponding vias disposed in the lower and upper dielectric layers.

In one embodiment, the lower and upper dielectric layers meet at a seam in the metallization layer.

In one embodiment, the vias are disposed in both of the lower and upper dielectric layers, and the metal lines are disposed only in the upper dielectric layer.

In one embodiment, the memory array includes a plurality of bit lines disposed in a dielectric layer disposed above the upper dielectric layer.

In one embodiment, the spin hall electrode of each of the 2T-1MTJ SHE electrode bit cells includes a metal selected from the group consisting of β-Tantalum (β-Ta), β-Tungsten (β-W), platinum (Pt), Cu doped with Bi, iridium (Ir), tungsten (W), a Ag/Bi bilayer, BiSe, or $MoS_2$.

In one embodiment, each transistors of each of the 2T-1MTJ SHE electrode bit cells is based on two semiconductor fins.

In an embodiment, a semiconductor structure includes a first plurality and a second plurality of semiconductor devices disposed above a substrate. A plurality of metal 1 (M1) lines is disposed in a first dielectric layer disposed above the first plurality of semiconductor devices. A plurality of source lines is disposed in the first dielectric layer above the second plurality of semiconductor devices. A plurality of metal 2 (M2) lines is disposed in an upper layer of a second dielectric layer disposed above a lower layer of the second dielectric layer disposed above the M1 lines. A plurality of spin hall effect electrode (SHE electrode)/magnetic tunnel junction (MTJ) stack pairings is disposed in the second dielectric layer above plurality of source lines. The SHE electrodes are disposed in the lower dielectric layer of the second dielectric layer. The MTJ stack are disposed in the upper dielectric layer of the second dielectric layer. A plurality of metal 3 (M3) lines is disposed in a third dielectric layer disposed above the plurality of M2 lines. A plurality of bitlines is disposed in the third dielectric layer above the plurality of SHE electrode/MTJ stack pairings.

In one embodiment, the semiconductor structure further includes a first etch stop layer disposed between the first and second dielectric layers.

In one embodiment, the semiconductor structure further includes a conductive layer disposed in openings of the first etch stop layer. The SHE electrode of each of the plurality of SHE electrode/MTJ stack pairings is disposed on and in contact with the conductive layer.

In one embodiment, the semiconductor structure further includes a second etch stop layer disposed between the second and third dielectric layers.

In one embodiment, each of the plurality of SHE electrode/MTJ stack pairings is included in a 2T1MTJ SHE electrode bit cell.

In one embodiment, the SHE electrode of each of the plurality of SHE electrode/MTJ stack pairings includes a metal selected from the group consisting of β-Tantalum (β-Ta), β-Tungsten (β-W), platinum (Pt), Cu doped with Bi, iridium (Ir), tungsten (W), a Ag/Bi bilayer, BiSe, or $MoS_2$.

In one embodiment, each of the second plurality of semiconductor devices is based on two semiconductor fins.

In one embodiment, each of the plurality of SHE electrode/MTJ stack pairings includes an MTJ stack disposed on a corresponding SHE electrode.

In an embodiment, a method of fabricating logic regions together with 2T1MTJ SHE electrode STTMRAM bit cell arrays on a common substrate includes forming a plurality of transistor structures above a substrate, forming contact metallization to diffusion contacts coupled to source and drain regions of the plurality of transistor structures, forming an etch stop layer above the contact metallization, forming openings the etch stop layer to expose portions of the contact metallization, forming a conductive layer in the openings of the etch stop layer, forming a lower dielectric layer above the conductive layer and the etch stop layer, forming a spin hall effect (SHE) metal layer in openings of the lower dielectric layer, forming magnetic tunnel junction (MTJ) stack layers above the SHE metal layer, patterning the MTJ stack layers to form an MTJ element, forming and planarizing an upper dielectric layer above the MTJ element, forming a layer comprising a plurality of bitlines above the upper dielectric layer.

In one embodiment, the SHE electrode has a width greater than the MTJ element.

In one embodiment, the method further includes, subsequent to forming and planarizing the upper dielectric layer and prior to forming the layer including the plurality of bitlines, forming a metal 2 (M2) layer in the upper dielectric layer.

In one embodiment, forming the layer including the plurality of bitlines includes forming a plurality of metal 3 (M3) lines.

In one embodiment, forming the plurality of transistor structure includes forming a plurality of semiconductor fins.

In one embodiment, forming the spin hall effect (SHE) metal layer in the openings of the lower dielectric layer includes forming an SHE metal material and overburden above the lower dielectric layer, and subsequently planarizing the SHE metal material to remove the overburden.

What is claimed is:

1. A logic processor, comprising:
a logic region comprising a metallization layer; and
a memory array comprising a plurality of two-transistor one magnetic tunnel junction (MTJ) spin hall effect electrode (2T-1MTJ SHE electrode) bit cells, wherein spin hall effect electrodes of the 2T-1MTJ SHE electrode bit cells are disposed in a lower dielectric layer laterally adjacent to the metallization layer of the logic region, the lower dielectric layer over a plurality of metal lines, and MTJs of the 2T-1MTJ SHE electrode bit cells are disposed in an upper dielectric layer laterally adjacent to the metallization layer of the logic region, wherein the lower dielectric layer is a single dielectric material layer, wherein a top surface of the spin hall effect electrodes of the 2T-1MTJ SHE electrode bit cells is co-planar with a top surface of the lower dielectric layer, wherein a bottom surface of the spin hall effect electrodes of the 2T-1MTJ SHE electrode bit cells is co-planar with a bottom surface of the lower dielectric layer, wherein the upper dielectric layer has a top surface and the memory array comprises an insulating spacer layer disposed adjacent to sidewalls of the MTJs of the 2T-1MTJ SHE electrode bit cells, the insulating spacer layer having a top surface co-planar with the top surface of the upper dielectric layer, and wherein the memory array comprises an etch stop layer below the lower dielectric layer and above the plurality of metal lines, a first conductive via in the etch stop layer and on a first one of the metal lines, a second conductive via in the etch stop layer and on a second one of the metal lines, the first conductive via and the second conductive via having a top surface co-planar with a top surface of the etch stop layer, the first conductive via having a width greater than a width of the first one of the metal lines, wherein one of the spin hall effect electrodes is coupled to the first one of the metal lines by the first conductive via, wherein the one of the spin hall effect electrodes is coupled to the second one of the metal lines by the second conductive via, and wherein the one of the spin hall effect electrodes completely overlaps the first conductive via and the second conductive via.

2. The logic processor of claim 1, wherein the insulating spacer layer is further across a top surface of the spin hall effect electrodes of the 2T-1MTJ SHE electrode bit cells.

3. The logic processor of claim 2, wherein the insulating spacer layer extends across a top surface of the lower dielectric layer.

4. The logic processor of claim 1, wherein the metallization layer comprises a layer of metal lines and corresponding vias disposed in the lower and upper dielectric layers.

5. The logic processor of claim 4, wherein the lower and upper dielectric layers meet at a seam in the metallization layer.

6. The logic processor of claim 4, wherein the vias are disposed in both of the lower and upper dielectric layers, and the metal lines are disposed only in the upper dielectric layer.

7. The logic processor of claim 1, wherein the memory array comprises a plurality of bit lines disposed in a dielectric layer disposed above the upper dielectric layer.

8. The logic processor of claim 1, wherein the spin hall electrode of each of the 2T-1MTJ SHE electrode bit cells comprises a metal selected from the group consisting of β-Tantalum (β-Ta), β-Tungsten (β-W), platinum (Pt), Cu doped with Bi, iridium (Ir), tungsten (W), a Ag/Bi bilayer, BiSe, or $MoS_2$.

9. The logic processor of claim 1, wherein a transistor of each of the 2T-1MTJ SHE electrode bit cells comprises two semiconductor fins.

10. A semiconductor structure, comprising:
a first plurality and a second plurality of semiconductor devices disposed above a substrate;
a plurality of metal 1 (M1) lines disposed in a first dielectric layer disposed above the first plurality of semiconductor devices, and a plurality of source lines disposed in the first dielectric layer above the second plurality of semiconductor devices;
a plurality of metal 2 (M2) lines disposed in an upper layer of a second dielectric layer disposed above a lower layer of the second dielectric layer disposed above the M1 lines, and a plurality of spin hall effect electrode (SHE electrode)/magnetic tunnel junction (MTJ) stack pairings disposed in the second dielectric layer above plurality of source lines, the SHE electrodes disposed in the lower dielectric layer of the second dielectric layer, and the MTJ stacks disposed in the upper dielectric layer of the second dielectric layer, wherein the lower dielectric layer is a single dielectric material layer, wherein a top surface of the SHE electrodes is co-planar with a top surface of the lower dielectric layer of the second dielectric layer, wherein a bottom surface of the SHE electrodes is co-planar with a bottom surface of the lower dielectric layer of the second dielectric layer, and wherein the upper dielectric layer of the second dielectric layer has a top surface co-planar with a top surface of the M2 lines, wherein an etch stop layer is below the lower layer of the second dielectric layer and above the plurality of source lines, a first conductive via in the etch stop layer and on a first one of the source lines, a second conductive via in the etch stop layer and on a second one of the source lines, the first conductive via and the second conductive via having a top surface co-planar with a top surface of the etch stop layer, the first conductive via having a width greater than a width of the first one of the source lines, wherein one of the SHE electrodes is coupled to the first one of the source lines by the first conductive via, wherein the one of the SHE electrodes is coupled to the second one of the source lines by the second conductive via, and wherein the one of the SHE electrodes completely overlaps the first conductive via and the second conductive via;
an insulating spacer layer disposed adjacent to sidewalls of the MTJ stacks, the insulating spacer layer having a top surface co-planar with the top surface of the upper dielectric layer of the second dielectric layer; and
a plurality of metal 3 (M3) lines disposed in a third dielectric layer disposed above the plurality of M2 lines, and a plurality of bitlines disposed in the third dielectric layer above the plurality of SHE electrode/MTJ stack pairings.

11. The semiconductor structure of claim 10, further comprising:
a second etch stop layer disposed between the second and third dielectric layers.

12. The semiconductor structure of claim 10, wherein each of the plurality of SHE electrode/MTJ stack pairings is included in a 2T-1MTJ SHE electrode bit cell.

13. The semiconductor structure of claim 10, wherein the SHE electrode of each of the plurality of SHE electrode/MTJ stack pairings comprises a metal selected from the group consisting of β-Tantalum (β-Ta), β-Tungsten (β-W), platinum (Pt), Cu doped with Bi, iridium (Ir), tungsten (W), a Ag/Bi bilayer, BiSe, or MoS2.

14. The semiconductor structure of claim 10, wherein each of the second plurality of semiconductor devices comprises two semiconductor fins.

15. The semiconductor structure of claim 10, wherein each of the plurality of SHE electrode/MTJ stack pairings comprises an MTJ stack disposed on a corresponding SHE electrode.

16. A method of fabricating logic regions together with 2T-1MTJ SHE electrode STT-MRAM bit cell arrays on a common substrate, the method comprising:
forming a plurality of transistor structures above the common substrate;
forming contact metallization to diffusion contacts coupled to source and drain regions of the plurality of transistor structures;
forming an etch stop layer above the contact metallization;
forming openings in the etch stop layer to expose a first source line and a second source line of the contact metallization;
forming a conductive layer in the openings of the etch stop layer;
planarizing the conductive layer to form a first conductive via and a second conductive via in the openings, the first conductive via and the second conductive via having a top surface co-planar with a top surface of the etch stop layer, and each of the first conductive via and the second conductive via having the width of a corresponding one of the openings;
forming a first dielectric layer above the conductive layer and the etch stop layer;
forming a spin hall effect (SHE) metal layer in openings of the first dielectric layer, wherein the first dielectric layer is a single dielectric material layer, wherein a top surface of the SHE metal layer is co-planar with a top surface of the first dielectric layer, and wherein a bottom surface of the SHE metal layer is co-planar with a bottom surface of the first dielectric layer, wherein the SHE metal layer comprises a SHE electrode, the SHE electrode on the first conductive via and on the second conductive via, wherein the SHE electrode completely overlaps the first conductive via and the second conductive via;
forming magnetic tunnel junction (MTJ) stack layers above the SHE metal layer;
patterning the MTJ stack layers to form an MTJ element;
forming an insulating spacer layer over the MTJ element and adjacent to sidewalls of the MTJ element;
forming a second dielectric layer above the MTJ element;
planarizing the second dielectric layer and the insulating spacer layer;
forming a metal 2 (M2) layer in the second dielectric layer, the metal 2 (M2) layer having top surface co-planar with a top surface of the second dielectric layer and co-planar with a top surface of the insulating spacer layer; and
forming a layer comprising a plurality of bitlines above the second dielectric layer.

17. The method of claim 16, wherein the SHE electrode has a width greater than the MTJ element.

18. The method of claim 16, wherein forming the layer comprising the plurality of bitlines comprises forming a plurality of metal 3 (M3) lines.

19. The method of claim 16, wherein forming the plurality of transistor structures comprises forming a plurality of semiconductor fins.

20. The method of claim 16, wherein forming the spin hall effect (SHE) metal layer in the openings of the first dielectric layer comprises forming an SHE metal material and overburden above the first dielectric layer, and subsequently planarizing the SHE metal material to remove the overburden.

* * * * *